US009106214B1

(12) United States Patent
Midya

(10) Patent No.: US 9,106,214 B1
(45) Date of Patent: Aug. 11, 2015

(54) PCM TO DIGITAL PWM USING PREDISTORTION

(71) Applicant: Pallab Midya, Palatine, IL (US)

(72) Inventor: Pallab Midya, Palatine, IL (US)

(73) Assignee: ADX Research, Inc., Schaumburg, IL (US)

( * ) Notice: Subject to any disclaimer, the term of this patent is extended or adjusted under 35 U.S.C. 154(b) by 117 days.

(21) Appl. No.: 13/936,128

(22) Filed: Jul. 5, 2013

(51) Int. Cl.
*H03K 7/08* (2006.01)
*H03F 3/217* (2006.01)
*H03K 3/017* (2006.01)
*H04L 25/49* (2006.01)
*H02M 7/5395* (2006.01)
*H02M 7/527* (2006.01)

(52) U.S. Cl.
CPC ............... *H03K 7/08* (2013.01); *H03F 3/2173* (2013.01); *H02M 7/527* (2013.01); *H02M 7/5395* (2013.01); *H03K 3/017* (2013.01); *H04L 25/4902* (2013.01)

(58) Field of Classification Search
CPC ...... H03K 7/08; H03K 3/017; H04L 25/4902; H02M 7/5395; H02M 7/527; H03F 3/2173
USPC ................... 332/109; 375/238; 370/205, 212; 363/41
See application file for complete search history.

(56) References Cited

U.S. PATENT DOCUMENTS

| 6,414,613 | B1 | 7/2002 | Midya et al. |
| 6,587,010 | B2 | 7/2003 | Wagh et al. |
| 6,606,044 | B2 | 8/2003 | Roeckner et al. |
| 6,665,338 | B1 | 12/2003 | Midya et al. |
| 7,142,597 | B2 | 11/2006 | Midya et al. |
| 7,227,487 | B1 | 6/2007 | Midya et al. |
| 7,825,726 | B2 | 11/2010 | Midya et al. |
| 2014/0375382 | A1 | 12/2014 | Midya |

OTHER PUBLICATIONS

Pallab Midya and Bill Roeckner, Large-Signal Design and Performance of a Digital PWM Amplifier, J. Audio Eng. Soc., vol. 58, No. 9, 2010, pp. 1-14.
Pallab Midya, Generation of Variable Frequency Digital PWM, Audio Engineering Society Convention ,Paper No. 7227, Presented at the 123rd Convention Oct. 5-8, 2007 New York, NY, USA, 10 pages.

(Continued)

*Primary Examiner* — Robert Pascal
*Assistant Examiner* — Richard Tan
(74) *Attorney, Agent, or Firm* — Patents and Licensing LLC; Daniel W Juffernbruch

(57) ABSTRACT

A PCM signal is converted to a PWM signal using predistortion to alleviate harmonics. A PCM predistorted signal is converted to the PWM and amplified. A third harmonic non-linear function receives the PCM signal and produces a third harmonic of the PCM signal. A third harmonic difference function takes one sixth of the third harmonic and produces a third harmonic PCM compensation signal. The PCM signal and the third harmonic PCM compensation signal are summed to produce a PCM predistorted signal for a full-bridge amplifier. A second harmonic nonlinear function produces a second harmonic of the PCM signal. A second harmonic function takes one fourth of the second harmonic to produce a second harmonic PCM compensation signal. The PCM signal, the third harmonic PCM compensation signal, and the second harmonic PCM compensation signal are summed to produce the PCM predistorted signal for a half-bridge amplifier.

20 Claims, 27 Drawing Sheets

(56) References Cited

OTHER PUBLICATIONS

Pallab Midya, Bill Roeckner, and Theresa Paulo, Recursive Natural Sampling for Digital PWM, Audio Engineering Society Convention, Paper No. 7228, Presented at the 123rd Convention Oct. 5-8, 2007 New York, NY, USA, 7 pages.

Pallab Midya and Matt Miller and Mark Sandier, Integral Noise Shaping for Quantization of Pulse Width Modulation, Audio Engineering Society 109th Convention Sep. 22-25, 2000 Los Angeles, California, USA, cover sheet plus pp. 1-29.

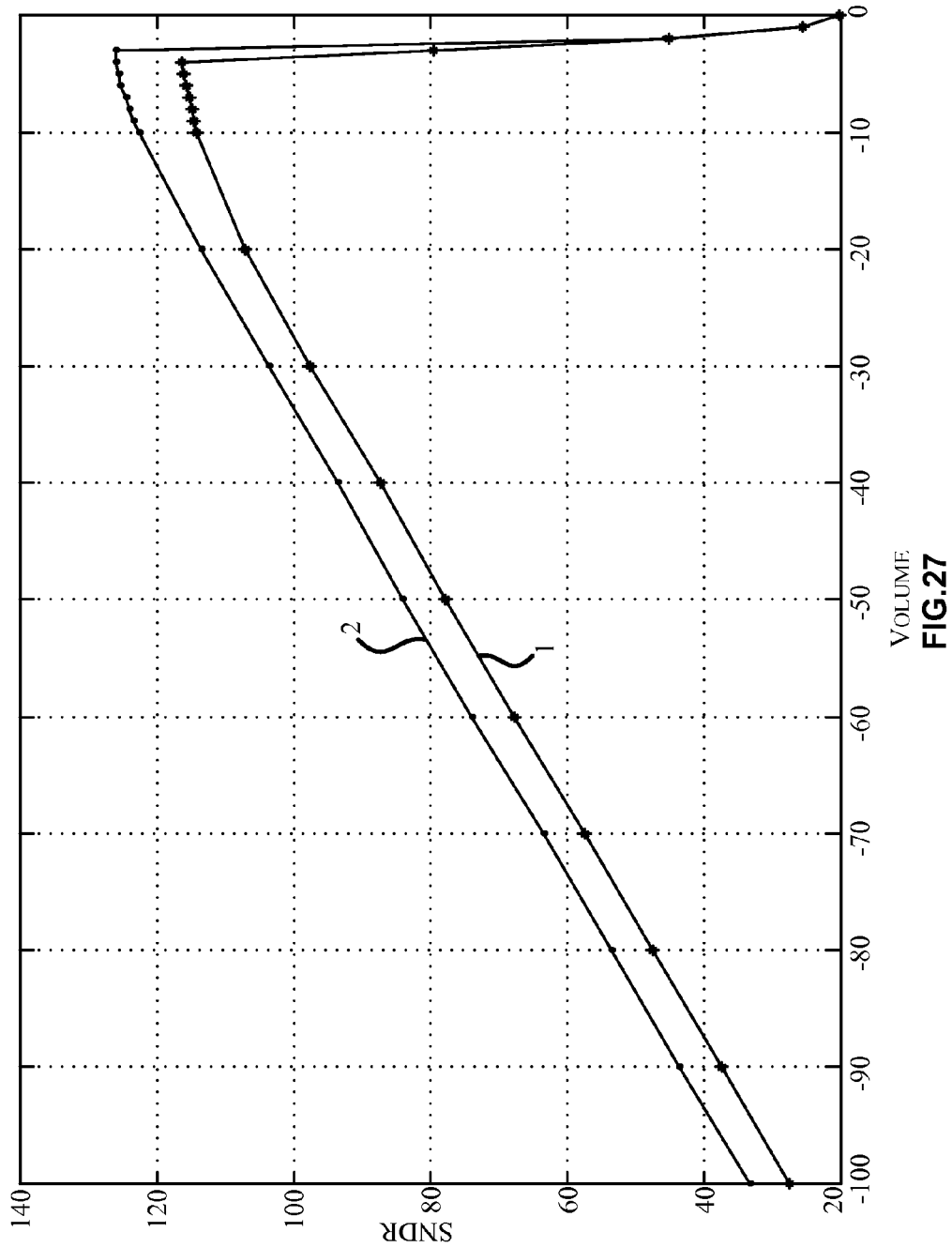

PCM TO DIGITAL PWM USING PREDISTORTION

BACKGROUND OF THE INVENTIONS

1. Technical Field

The present inventions relate to PCM to PWM digital signal conversion and, more particularly, relate to PCM to a PWM digital signal or a pair of digital PWM signals conversion for audio amplification.

2. Description of the Related Art

Natural sampling is a method for conversion of PCM (Pulse Code Modulation) signal to PWM (Pulse Width Modulation). After natural sampling there is still the computation and complexity of quantization of the PWM. The computational complexity of conversion from PCM to PWM using natural sampling is very high. Quantization of PWM is even more computationally intensive. Techniques like Integral Noise Shaping perform noise shaping for PWM signals with significant computational complexity.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The details of the preferred embodiments will be more readily understood from the following detailed description when read in conjunction with the accompanying drawings wherein:

FIG. 27 illustrates a plot of Volume vs. SNDR (Signal to Noise plus Distortion Ratio) for a Pair of Digital PWM Signals according to a third embodiment of the present invention.

DETAILED DESCRIPTION OF THE PREFERRED EMBODIMENTS

Figure 1:
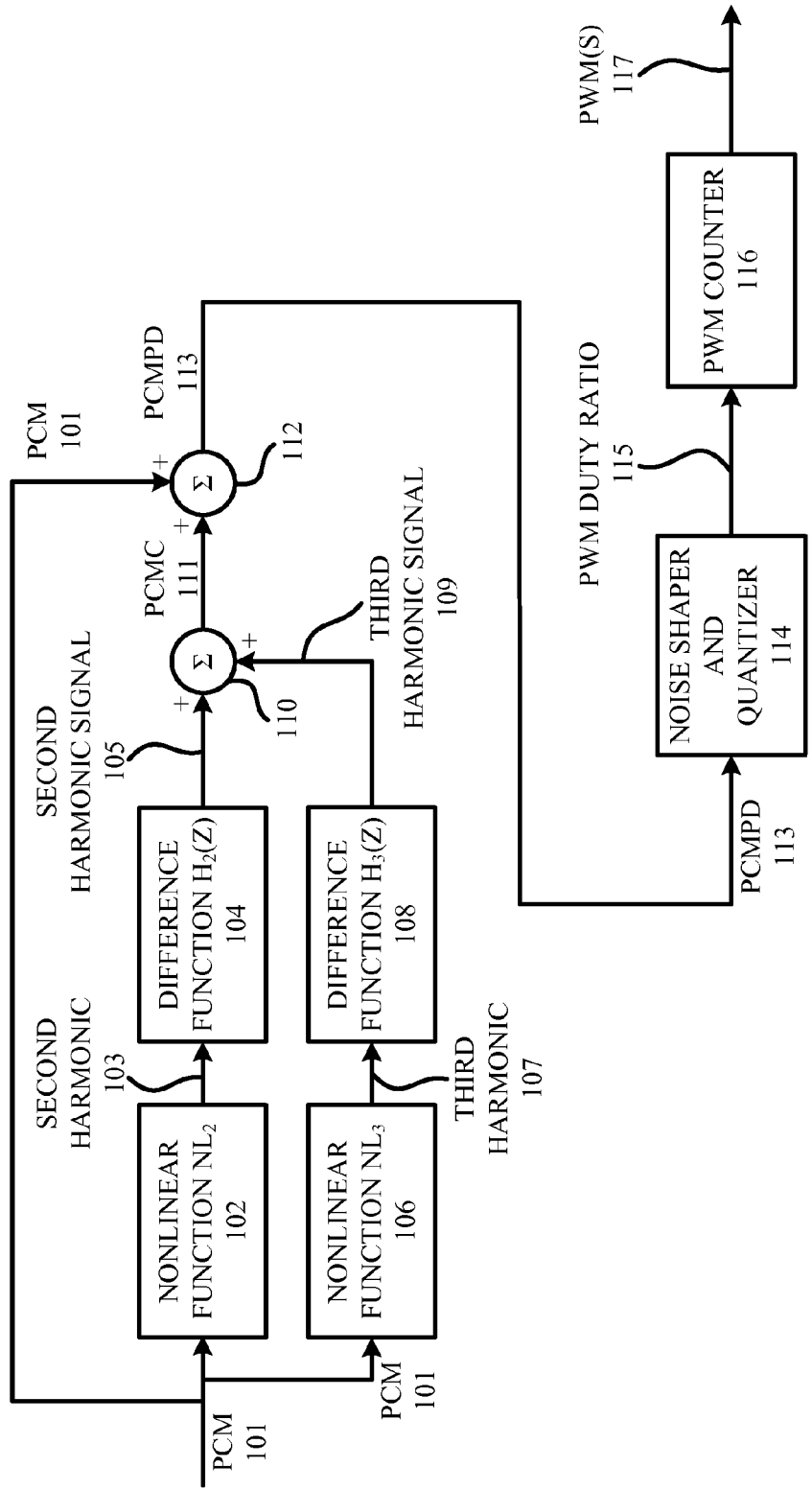
FIG. 1 illustrates a schematic block diagram of the PCM to Digital PWM Conversion System according to one or more embodiments of the present invention.

FIG. 1 illustrates a schematic block diagram of a PCM to Digital PWM Conversion System 100 according to one or more embodiments of the present inventions. A Second Harmonic Nonlinear Function unit $NL_2$ 102 takes input from a PCM signal 101 and produces a Second Harmonic signal 103 that is input to the Difference Function $H_2(Z)$ 104. A Third Harmonic Nonlinear Function unit $NL_3$ 106 also takes input from the PCM signal 101 and produces Third Harmonic signal 107 that is input to the Difference Function unit $H_3(Z)$ 108. The Difference Function unit $H_2(Z)$ 104 takes the input Second Harmonic signal 103 and produces the output Second Harmonic signal 105. The Difference Function unit $H_3(Z)$ 108 takes the input Third Harmonic signal 107 and produces the output Third Harmonic signal 109. Adder 110 sums the Second Harmonic signal 105 and Third Harmonic signal 109 and produces output PCMC signal 111. The second order and third order nonlinearities of the PWM process are estimated and added together to produce the PCM compensation signal PCMC 111. Adder 112 sums the PCM compensation signal PCMC 111 and the original PCM signal 101 and produces a PCM predistorted signal output PCMPD 113. The PCM predistorted signal PCMPD 113 is the predistorted version of the original PCM signal 101. An objective of this predistortion is that the output PWM(s) signal(s) have good linearity. Another objective is that harmonics are eliminated.

Figure 2:
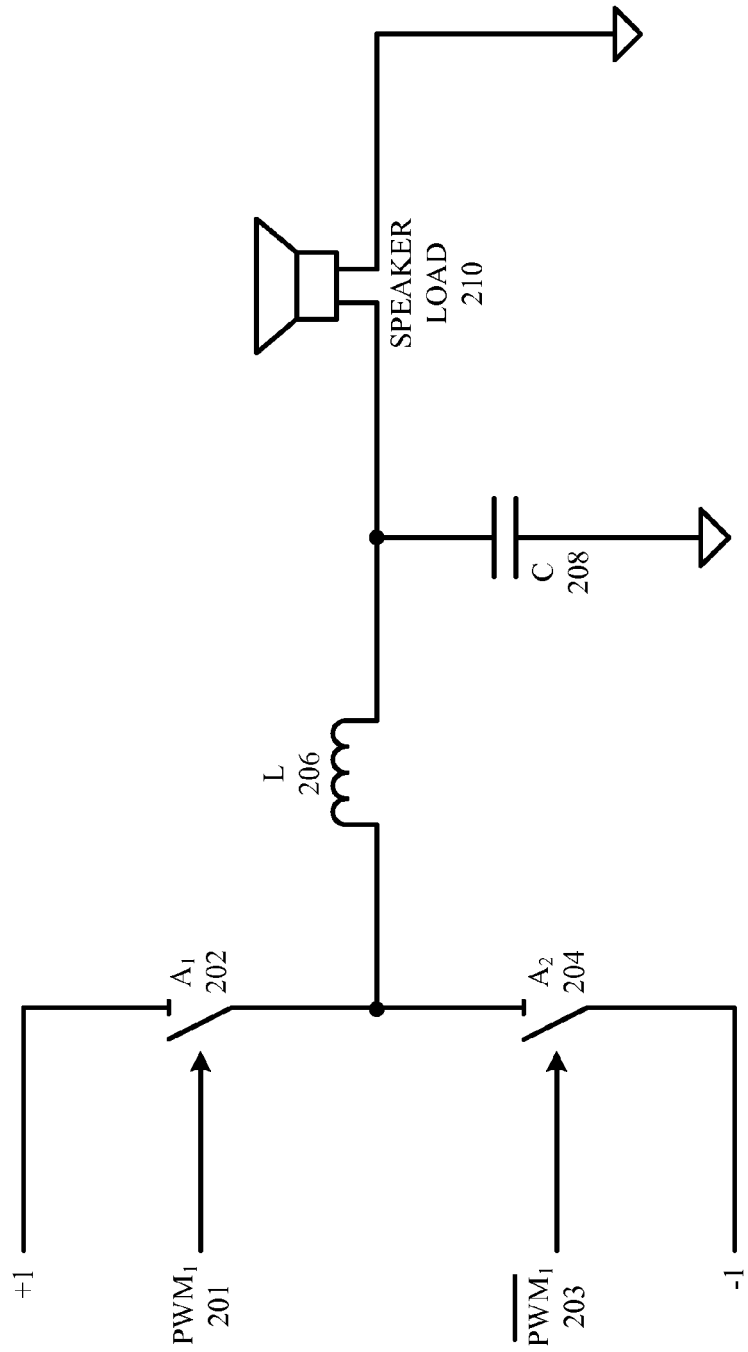
FIG. 2 illustrates a schematic diagram of Half Bridge Power Stage according to an embodiment of the present inventions.
Figure 3:
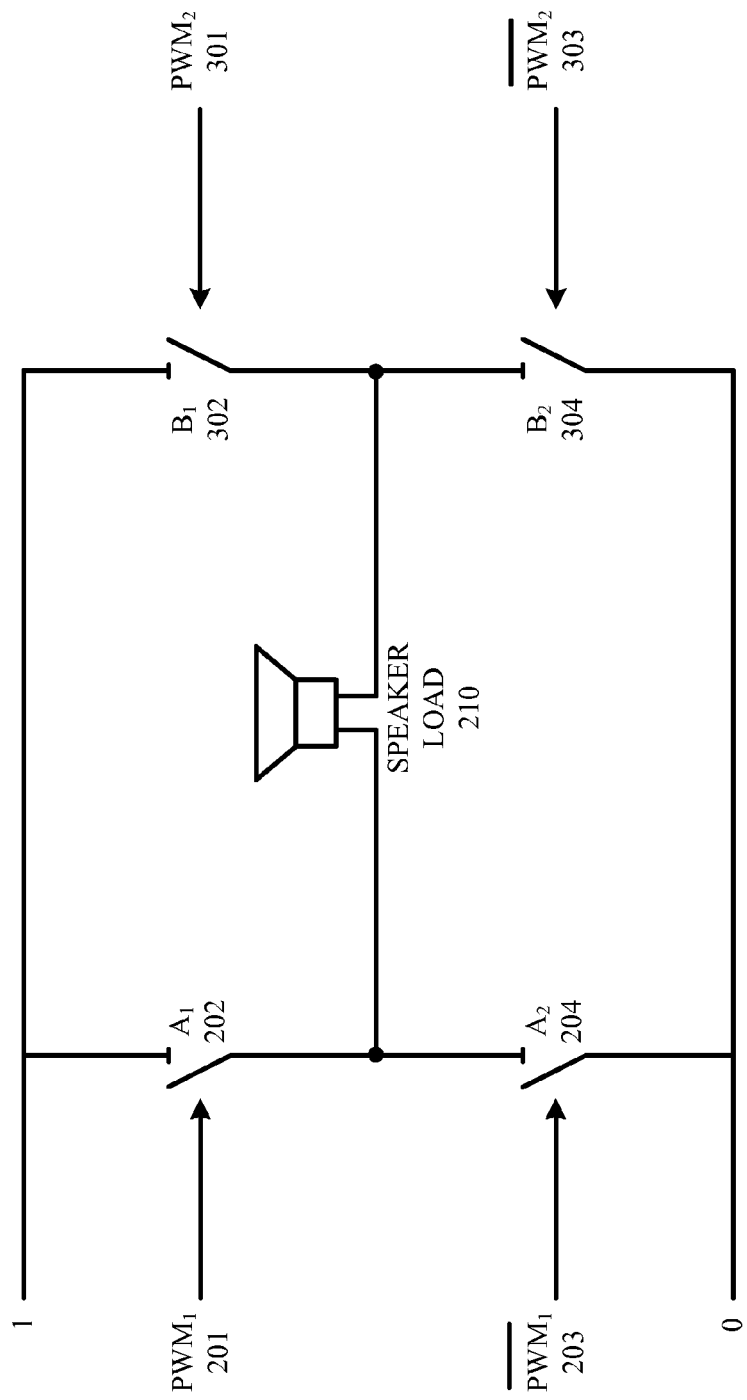
FIG. 3 illustrates a schematic diagram of Full Bridge Power Stage according to an embodiment of the present inventions.

A Noise Shaper and Quantizer 114 and a PWM Counter 116 perform PCM to PWM conversion of the PCM predistorted signal PCMPD 113 to a signal or a pair of PWM signals. The PCM predistorted signal PCMPD 113 is input to the Noise Shaper and Quantizer 114. Noise Shaper and Quantizer 114 takes the PCM predistorted signal PCMPD 113 and produces output PWM Duty Ratio signal 115. The PWM Duty Ratio signal 115 is quantized such that it can be generated with a counter. PWM Counter 116 has input PWM Duty Ratio signal 115 and produces output PWM signal or signals 117. FIGS. 2 and 3 respectively illustrate power stages that can take a single PWM signal or a pair of digital PWM signals from the PWM Counter 116.

FIG. 2 illustrates a schematic diagram of Half Bridge Power Stage 200 according to an embodiment of the present inventions. Switch $A_1$ 202 and Switch $A_2$ 204 takes different input from $PWM_1$ 201 and its logical complement $\overline{PWM_1}$ 203 respectively. These inputs 202 and 203 in certain embodiments can come from the single signal output of PWM Counter 116 of FIG. 1. The power supply for the half bridge power stage is typically bipolar and represented here in normalized form as +1 and −1. Inductor L 206 is connected to connecting point of both Switches $A_1$ 202 and $A_2$ 204. Capacitor C 208 is connected to the output node and the inductor L 206. The Speaker Load 210 is connected between the output node and ground.

FIG. 3 illustrates a schematic diagram of Full Bridge Power Stage 300 according to an embodiment of the present inventions. Switch $A_1$ 202 and Switch $A_2$ 204 take complementary inputs from $PWM_1$ 201 and $\overline{PWM_1}$ 203. These inputs 201 and 203 in certain embodiments can come from one side of the pair signal output from the PWM Counter 116 of FIG. 1. Switch $B_1$ 302 and Switch $B_2$ 304 take complementary inputs from $PWM_2$ 301 and $\overline{PWM_2}$ 303. These inputs 301 and 303 in certain embodiments can come from the other side of the pair signal output from the PWM Counter 116 of FIG. 1. Speaker Load 210 is connected to the connecting points of Switches $A_1$ 202, $A_2$ 204 and $B_1$ 302, $B_2$ 304.

Figure 4:
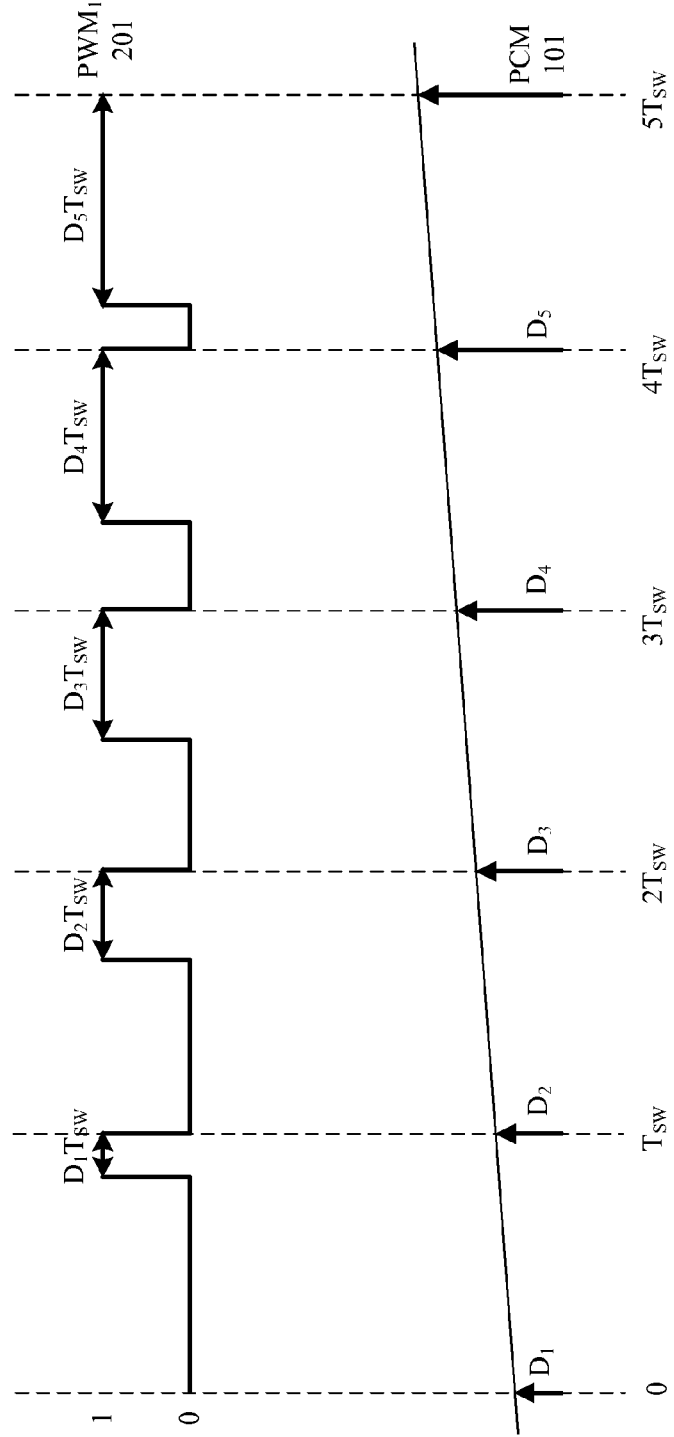
FIG. 4 illustrates a Timing Waveform of Digital PWM with Rising Edge Modulation for driving a Half Bridge Power Stage according to a first embodiment of the present inventions.

FIG. 4 illustrates a Timing Waveform of Digital PWM with Rising Edge Modulation 400 for driving a Half Bridge Power Stage 200 according to a first embodiment of the present invention. The PWM signal goes from Low to High in each cycle lasting a period $T_{SW}$. The PCM signal inputs are $D_1$, $D_2$, $D_3$, $D_4$ and $D_5$. The low to high switching time of the PWM signal is mapped to the PCM input signal. Thus the rising edges of the $PWM_1$ signal 201 is variable depending on the level of the PCM 101 signal. Note that the PCM signal has been chosen to have a range from 0 to 1 to map to a duty ratio of 0 to 1. The equations for predistortion are also based on this PCM range. Changing the range of the PCM signal would change the form of the predistortion equations.

Figure 5:
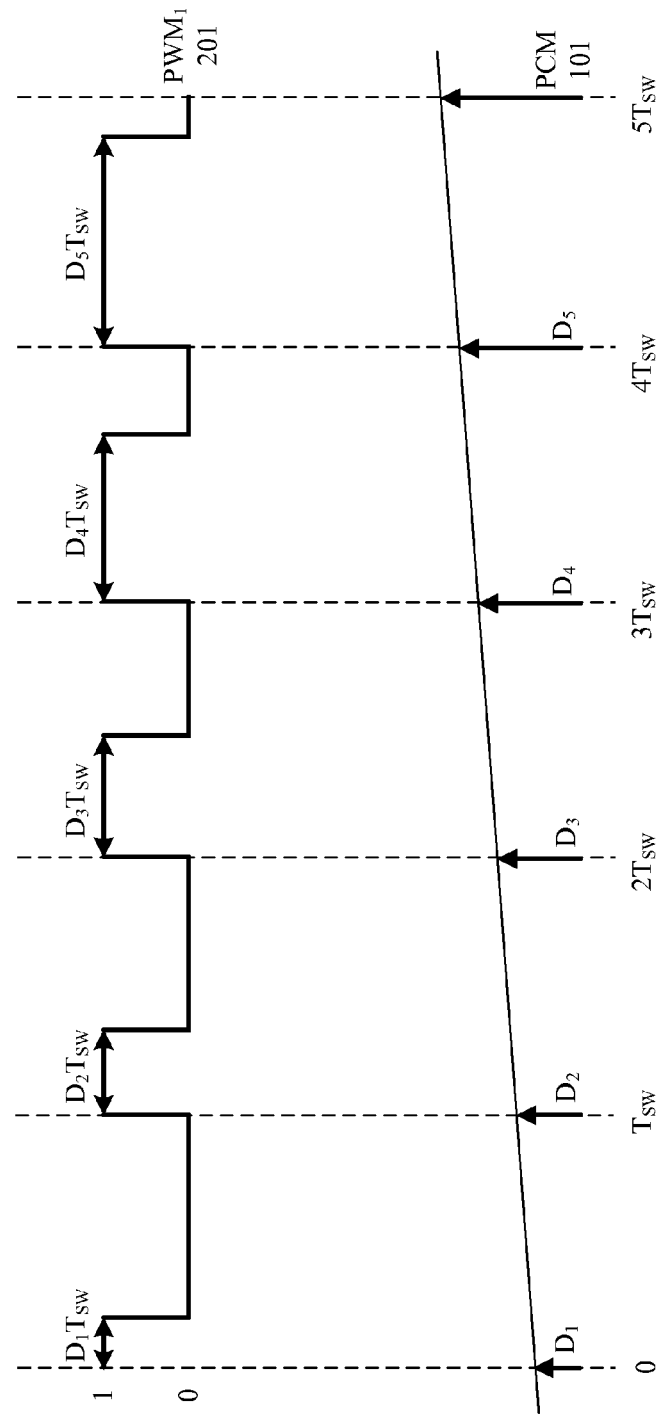
FIG. 5 illustrates a Timing Waveform of Digital PWM with Falling Edge Modulation for driving a Half Bridge Power Stage according to a second embodiment of the present invention.

FIG. 5 illustrates a Timing Waveform of Digital PWM with Falling Edge Modulation 500 for driving a Half Bridge Power Stage 200 according to a second embodiment of the present invention. The PWM signal goes from High to Low in each cycle lasting a period $T_{SW}$. The PCM signal inputs are $D_1$, $D_2$, $D_3$, $D_4$ and $D_5$. The high to low switching time of the PWM signal is mapped to the PCM input signal. Thus the falling edges of the $PWM_1$ signal 201 are variable depending on the level of the PCM 101 signal. Note that the PCM signal has been chosen to have a range from 0 to 1 to map to a duty ratio of 0 to 1. The equations for predistortion are also based on this PCM range. Changing the range of the PCM signal would change the form of the predistortion equations.

Figure 6:
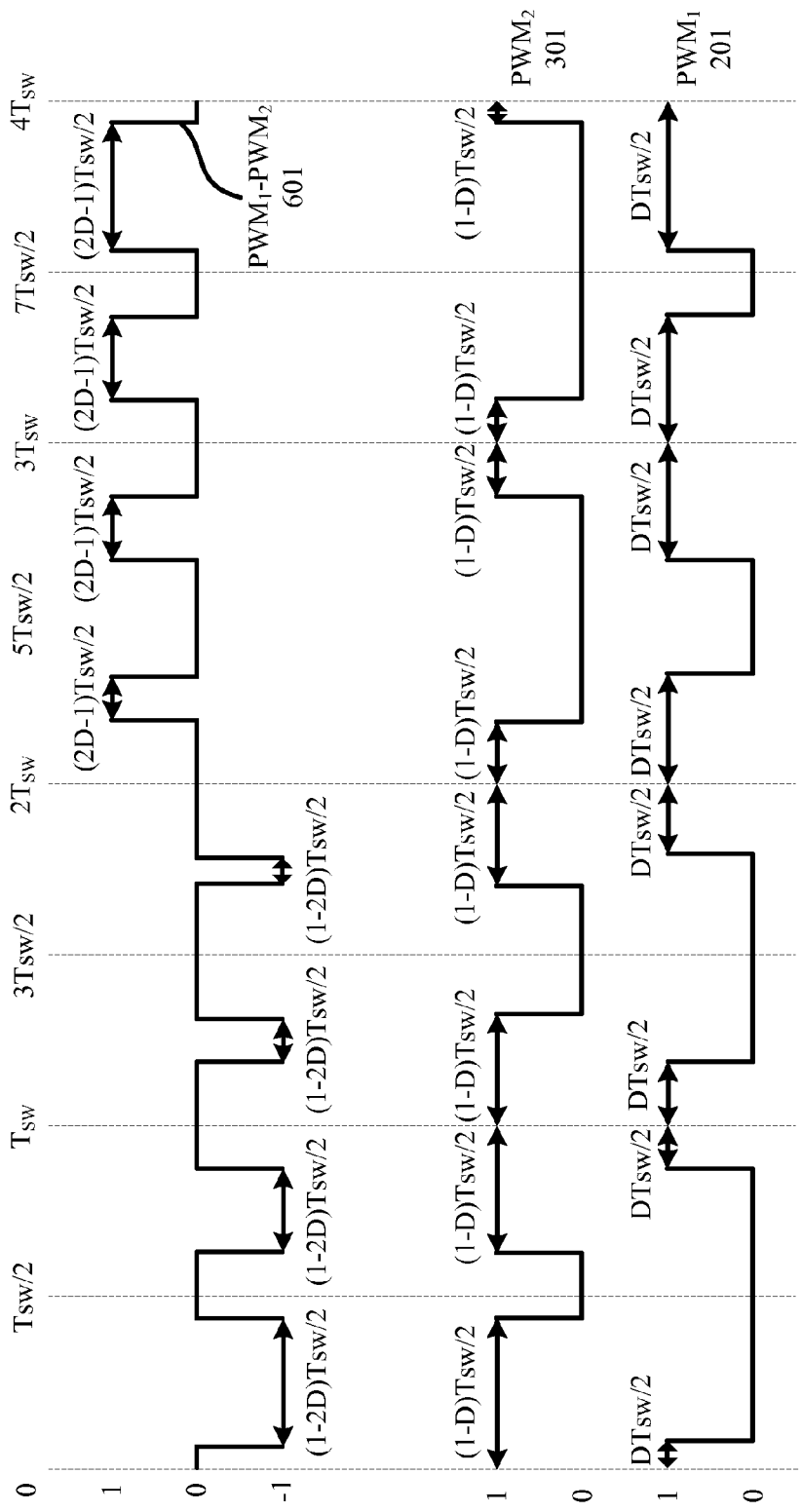
FIG. 6 illustrates a Timing Diagram for a Pair of Digital PWM Signals for driving a Full Bridge Power Stage according to a third embodiment of the present invention.

FIG. 6 illustrates a Timing Diagram for a Pair of Digital PWM Signals with both Rising Edge and Falling Edge Modulation 600 for driving a Full Bridge Power Stage 300 according to a third embodiment of the present inventions. The pair of PWM signals $PWM_1$ 201 and $PWM_2$ 301 The differential signal $PWM_1$-$PWM_2$ 601 is also plotted. The period of the PWM signals is Tsw. The duty ratio of the $PWM_1$ signal is D and the duty ratio of the $PWM_2$ signal is (1-D). The PWM signals start at 1 at the beginning of the cycle. At half way through the cycle Tsw/2 both PWM signals are 0. At the end of the cycle at Tsw the PWM signals are 1 again. FIG. 6 shows a range of duty ratios from low to high and the corresponding PWM signals. Note that the PCM signal has been chosen to have a range from 0 to 1 to map to a duty ratio of 0 to 1. The equations for predistortion are also based on this PCM range. Changing the range of the PCM signal would change the form of the predistortion equations.

Figure 7:
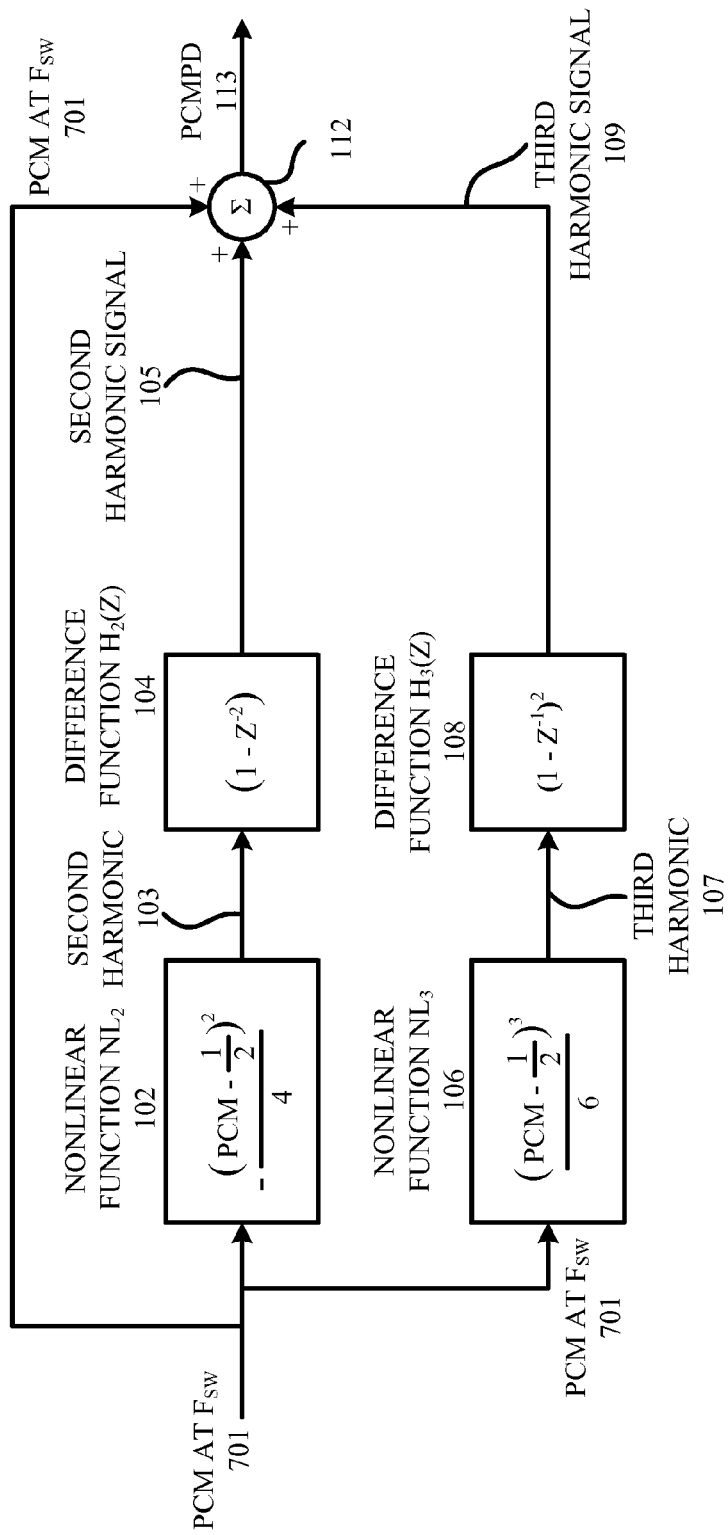
FIG. 7 illustrates a block diagram of Predistortion for Digital PWM with Rising Edge Modulation according to the first embodiment of the present inventions.

FIG. 7 illustrates a schematic Block Diagram of Predistortion for Digital PWM with Rising Edge Modulation 700 according to the first embodiment of the present inventions. A Second Harmonic Nonlinear Function unit $NL_2$ 102 takes input from a PCM signal at $F_{SW}$ 701 and produces a Second Harmonic signal 103 that is input to the Difference Function $H_2(Z)$ 104. A Third Harmonic Nonlinear Function unit $NL_3$ 106 also takes input from the PCM signal at $F_{SW}$ 701 and produces Third Harmonic signal 107 that is input to the Difference Function unit $H_3(Z)$ 108. The Difference Function unit $H_2(Z)$ 104 takes the input Second Harmonic signal 103 and produces the output Second Harmonic Signal 105. The Difference Function unit $H_3(Z)$ 108 takes the input Third Harmonic signal 107 and produces the output Third Harmonic Signal 109. Adder 112 sums the Second Harmonic signal 105, Third Harmonic signal 109 and PCM signal at $F_{SW}$

701 and produces PCM predistorted signal output PCMPD 113. The second order and third order nonlinearities of the PWM process are estimated and added together to produce the signal PCMPD 113. PCMPD 113 is the predistortion compensation for correcting the nonlinearity associated with falling edge modulation digital PWM. An objective of this predistortion is that the output PWM signal has good linearity. Another objective is that harmonics are eliminated. Note that the PCM signal has been chosen to have a range from 0 to 1 to map to a duty ratio of 0 to 1. The equations for predistortion are also based on this PCM range. Changing the range of the PCM signal would change the form of the predistortion equations in FIG. 7.

Figure 8:
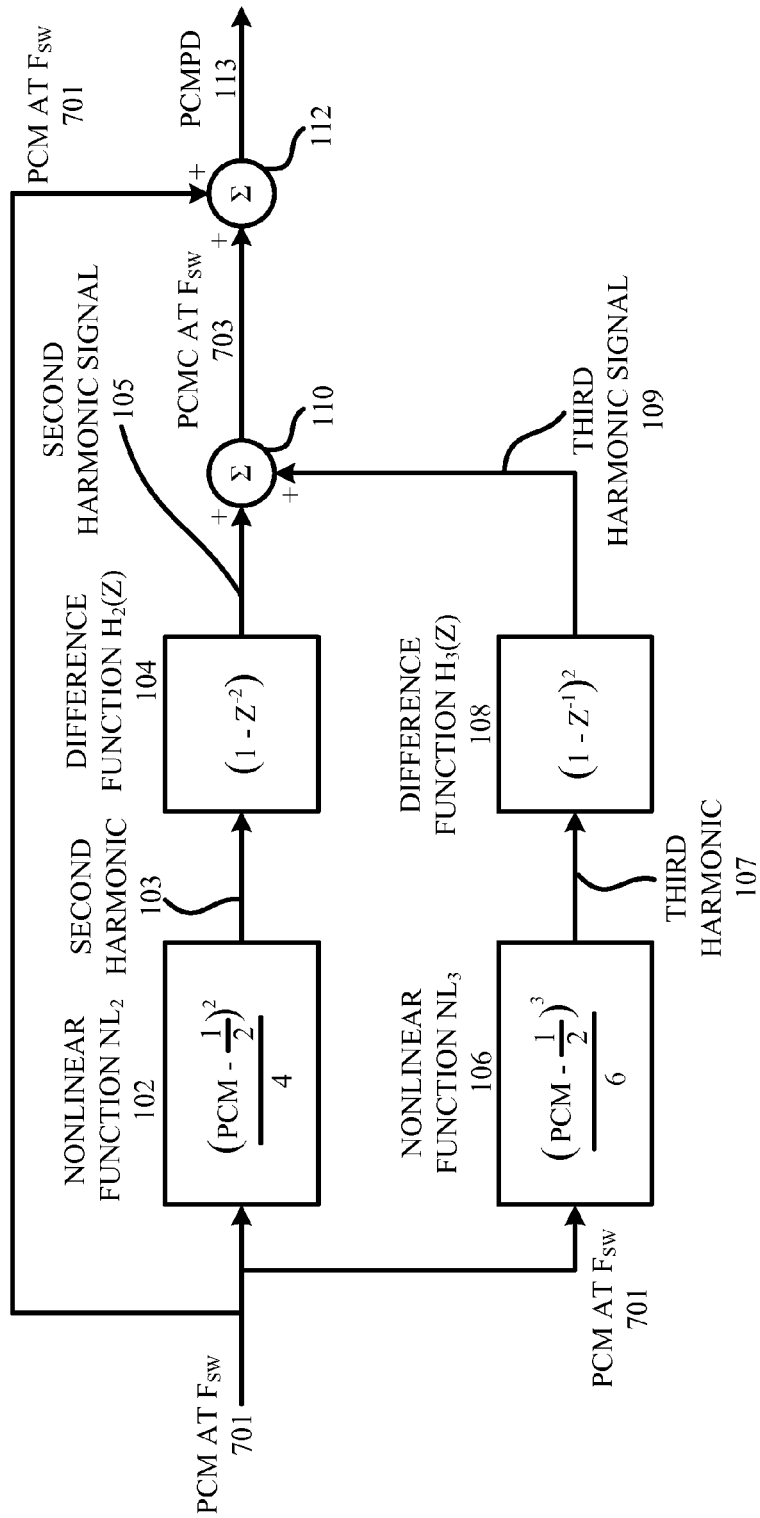
FIG. 8 illustrates a block diagram of Predistortion for Digital PWM with Falling Edge Modulation according to the second embodiment of the present inventions.

FIG. 8 illustrates a schematic Block Diagram of Predistortion for Digital PWM with Falling Edge Modulation 800 according to the second embodiment of the present inventions. A Second Harmonic Nonlinear Function unit $NL_2$ 102 takes input from a PCM signal at $F_{SW}$ 701 and produces a Second Harmonic signal 103 that is input to the Difference Function unit $H_2(Z)$ 104. A Third Harmonic Nonlinear Function unit $NL_3$ 106 also takes input from the PCM signal at $F_{SW}$ 701 and produces Third Harmonic signal 107 that is input to the Difference Function unit $H_3(Z)$ 108. The Difference Function unit $H_2(Z)$ 104 takes the input Second Harmonic signal 103 and produces the output Second Harmonic signal 105. The Difference Function unit $H_3(Z)$ 108 takes the input Third Harmonic signal 107 and produces the output Third Harmonic signal 109. Adder 110 sums the Second Harmonic signal 105 and Third Harmonic signal 109 and produces output PCMC signal at $F_{SW}$ 703. The second order and third order nonlinearities of the PWM process are estimated and added together to produce the PCM compensation signal PCMC at $F_{SW}$ 703. Adder 112 sums the input signals PCMC at $F_{SW}$ 703 and PCM signal at $F_{SW}$ 701 and produces the PCM predistorted signal output PCMPD 113. PCMPD 113 is the predistorted version of the original PCM signal 701. PCMC at $F_{SW}$ 703 is the predistortion compensation for correcting the nonlinearity associated with Rising Edge Modulation Digital PWM. An objective of this predistortion is that the output PWM(s) signal(s) have good linearity. Another objective is that harmonics are eliminated.

Note that the Nonlinear Function $NL_2$ is inverted in polarity between the Rising and Falling Edge Digital PWM Predistortion block diagrams 700 and 800. Also note that two summation blocks 110 and 112 are used in block diagram 800 where only one summation block is block diagram 700 but they are mathematically equivalent. Note also that the PCM signal has been chosen to have a range from 0 to 1 to map to a duty ratio of 0 to 1. The equations for predistortion are also based on this PCM range. Changing the range of the PCM signal would change the form of the predistortion equations in FIG. 8.

Figure 9:
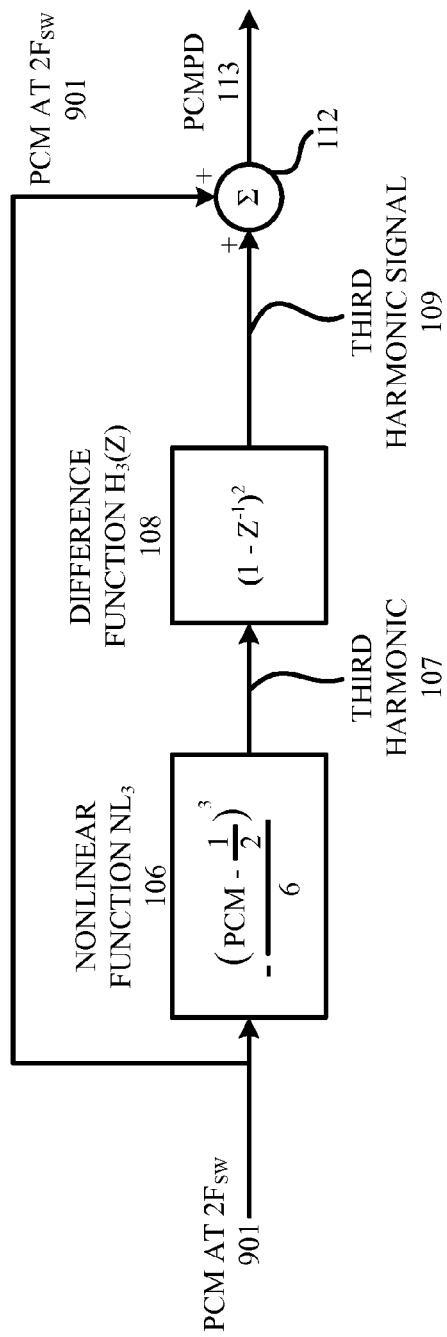
FIG. 9 illustrates a block diagram of Predistortion for a Pair of Digital PWM Signals for driving a Full Bridge Power Stage according to a third embodiment of the present invention.

FIG. 9 illustrates a schematic block diagram of Predistortion for a Pair of Digital PWM Signals for driving a Full Bridge Power Stage 900 according to the third embodiment of the present inventions. A Third Harmonic Nonlinear Function unit $NL_3$ 106 takes input from a PCM signal at $2F_{SW}$ 901 and produces a Third Harmonic signal 107 that is input to the Difference Function unit $H_3(Z)$ 108. The Difference Function unit $H_3(Z)$ 108 takes the input Third Harmonic signal 107 and produces the output Third Harmonic Signal 109. Adder 112 sums the Third Harmonic signal 109 and PCM signal at $2F_{SW}$ 901 and produces predistorted PCM signal output PCMPD 113. The third order nonlinearities of the PWM process are estimated and added together to produce the predistorted PCM output signal PCMPD 113. An objective of this predistortion is that the output PWM signal has good linearity. Another objective is that harmonics are eliminated. In this embodiment of the invention the PCM is at rate 2 Fsw because both edges of the PWM are being modulated. Note that the PCM signal has been chosen to have a range from 0 to 1 to map to a duty ratio of 0 to 1. The equations for predistortion are also based on this PCM range. Changing the range of the PCM signal would change the form of the predistortion equations in FIG. 9.

Figure 10:
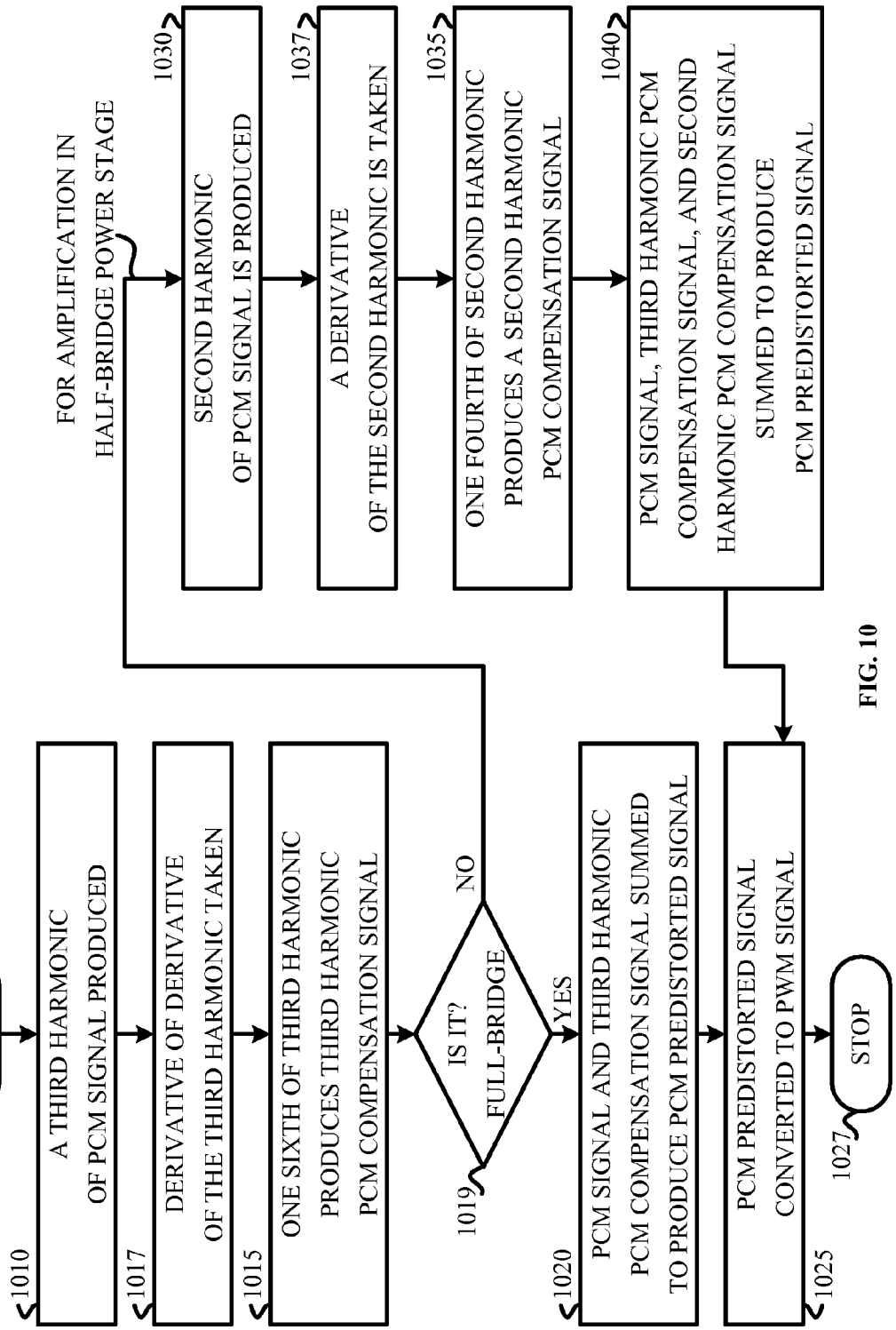
FIG. 10 illustrates a Flowchart for Conversion from PCM to Digital PWM according to one or more embodiments of the present inventions.

FIG. 10 illustrates a Flowchart for Conversion from PCM to Digital PWM 1000 according to an embodiment of the present inventions. This Flowchart to provide a PWM output that tracks a PCM signal input.

At step 1005 the flow begins. A Third Harmonic of the PCM signal is produced at step 1010. A derivative of a derivative of the Third Harmonic is taken at step 1017. One sixth of the Third Harmonic produces a Third Harmonic PCM compensation signal at step 1015. A decision box 1019 checks whether the power stage is a full bridge power stage which is driven by a pair of digital PWM signals or a half bridge power stage driven by a single digital PWM signal.

For amplification in a Full-Bridge Power Stage, the PCM signal and the Third Harmonic PCM compensation are summed to produce a PCM predistorted signal at step 1020. The PCM predistorted signal is converted to the PWM signal at step 1025.

For amplification in a Half-Bridge Power Stage, a Second harmonic of the PCM signal is produced at step 1030. A Derivative of the Second harmonic is taken at step 1037. One fourth of the Second Harmonic produces a Second Harmonic PCM compensation signal at step 1035. The PCM signal, the Third Harmonic PCM compensation signal, and the Second Harmonic PCM compensation signal are summed to produce the PCM predistorted signal at step 1040. At step 1027 the flow ends.

The decision step 1019 permits the flow to be implemented for an application universal to both of the full-bridge or the half-bridge power stages. The flow can also be implemented without the decision step 1019 for half-bridge and for full-bridge without steps 1019, 1030, 1037, 1035 and 1040.

Figure 11:
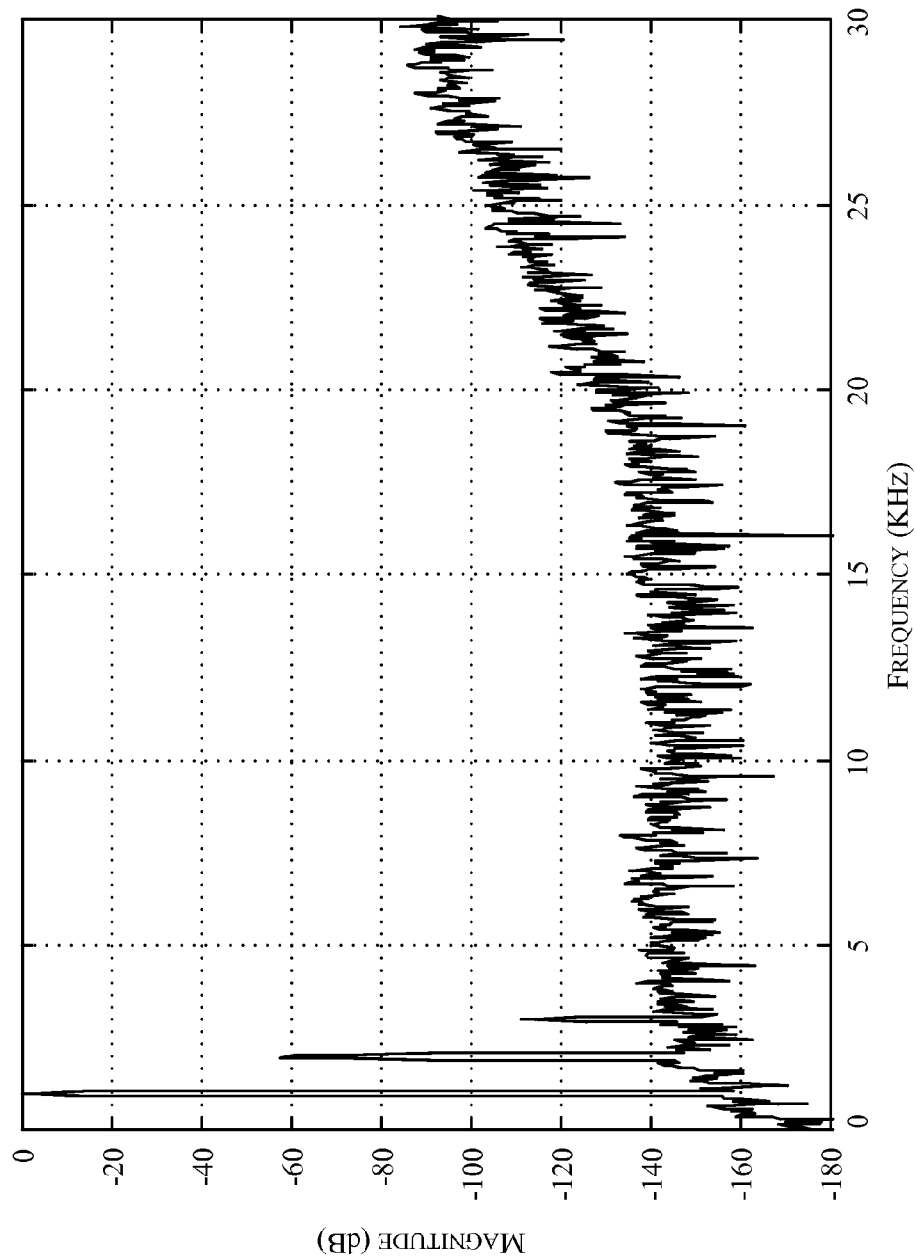
FIG. 11 illustrates a spectrum plot over frequency of a Single Tone Input Signal at 1 KHz for Rising Edge Modulation without the Predistortion for correcting the PWM nonlinearity.

FIG. 11 illustrates a spectrum plot over frequency of a Single Tone Input Signal at 1 KHz for Rising Edge Modulation without the Predistortion 1100 for correcting the PWM nonlinearity. The switching frequency is chosen to be 800 KHz. The highest undesired spectral content is the second and third harmonics at twice and thrice the modulation frequency at 2 KHz and 3 KHz.

Figure 12:
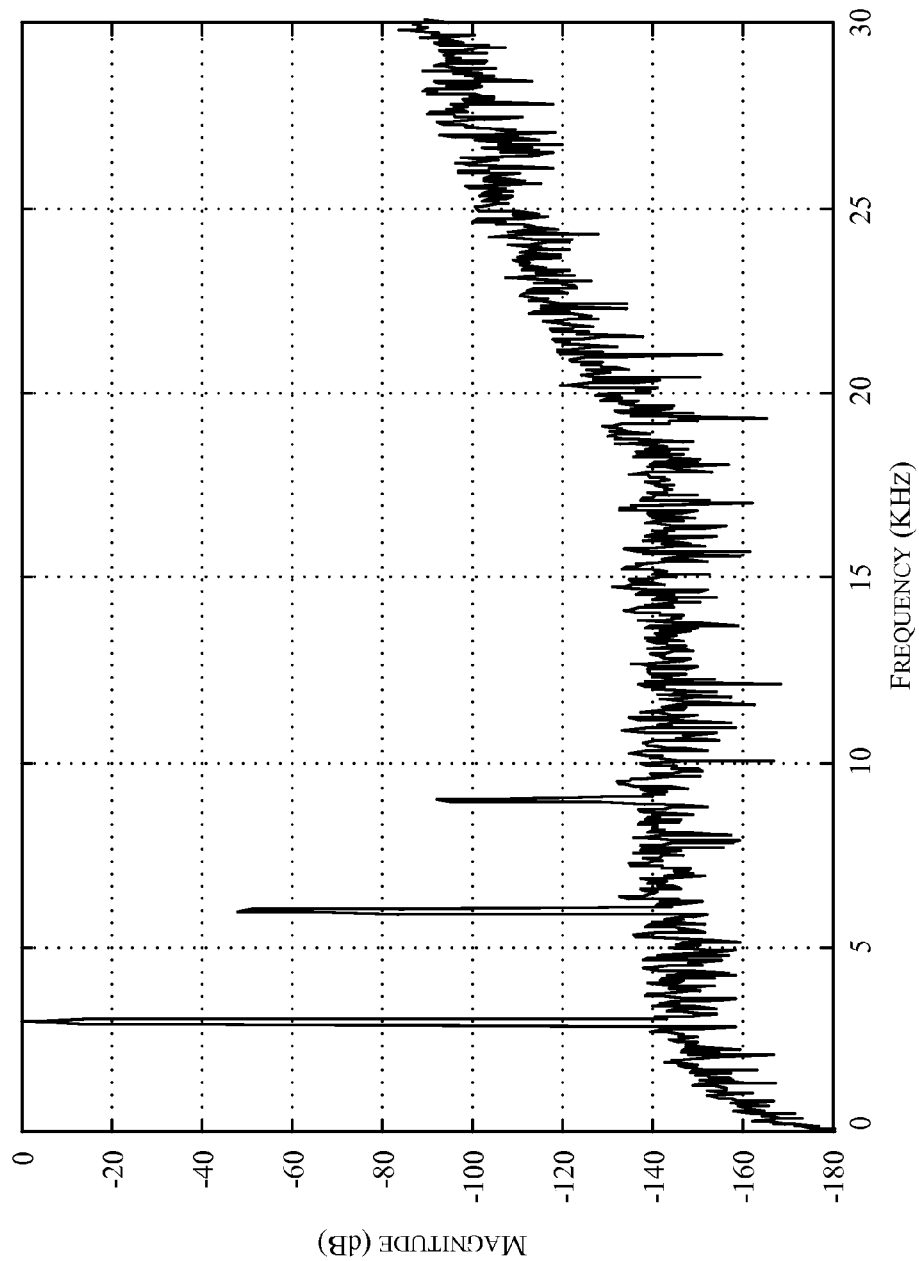
FIG. 12 illustrates a spectrum plot over frequency of a Single Tone Input Signal at 3 KHz for Rising Edge Modulation without the Predistortion for correcting the PWM nonlinearity.

FIG. 12 illustrates a spectrum plot over frequency of a Single Tone Input Signal at 3 KHz for Rising Edge Modulation without the Predistortion 1200 for correcting the PWM. The switching frequency is chosen to be at 800 KHz. The highest undesired spectral content are the second and third harmonics at twice and thrice the modulation frequency at 6 KHz and 9 KHz. Relative to FIG. 11 the level of the second harmonic is higher by factor of 3 or about 9.5 dB. Relative to FIG. 11 the level of the third harmonic is higher by factor of 9 or about 19 dB. The modulation frequency in FIG. 12 is also 3 times higher than in FIG. 11.

Figure 13:
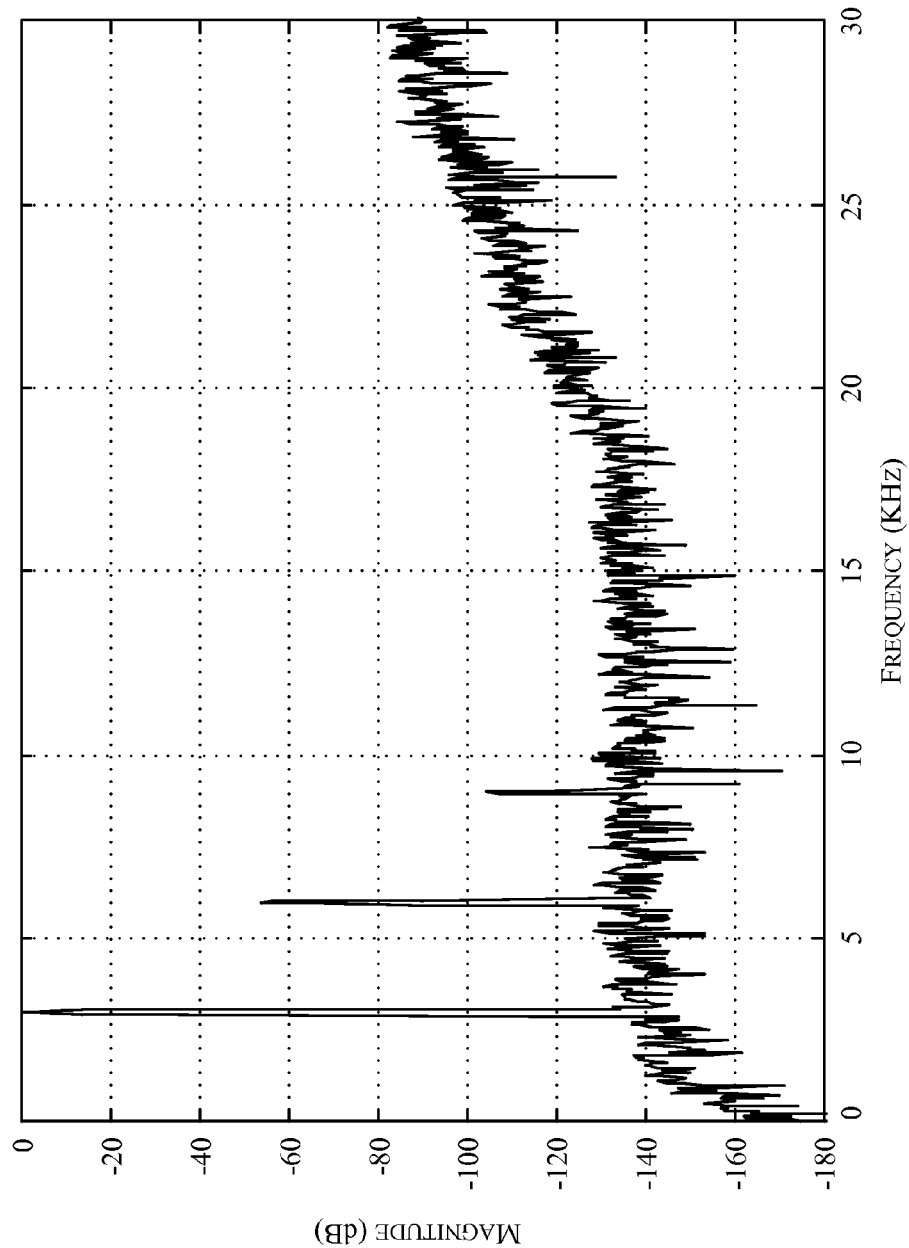
FIG. 13 illustrates a spectrum plot over frequency of a Single Tone Input Signal at 3 KHz at Reduced Volume for Rising Edge Modulation without the Predistortion for correcting the PWM nonlinearity.

FIG. 13 illustrates a spectrum plot over frequency of a Single Tone Input Signal at 3 KHz at Reduced Volume for Rising Edge Modulation without the Predistortion 1300 for correcting the PWM. The switching frequency is chosen to be at 800 KHz. The highest undesired spectral content is the second and third harmonics at twice and thrice the modulation frequency at 6 KHz and 9 KHz. Relative to FIG. 12 the volume has been reduced by half or 6 dB. Since the spectrum plot are normalized to make the desired tone at 0 dB all the levels have been boosted by 6 dB. Note that the levels of the harmonics are further reduced by 6 dB and 12 dB.

Figure 14:
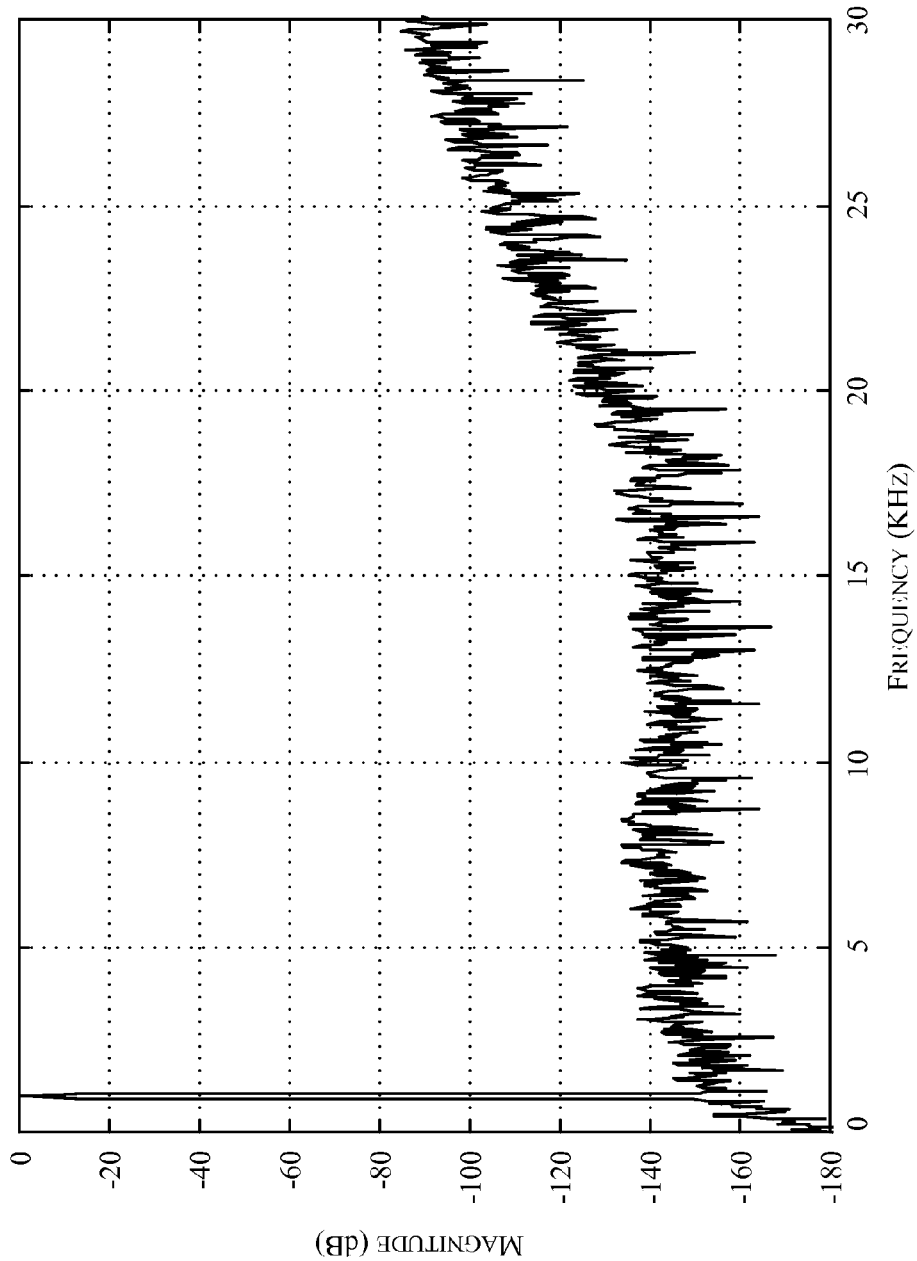
FIG. 14 illustrates a spectrum plot over frequency of a Single Tone Input Signal at 1 KHz for Rising Edge Modulation with the Predistortion for correcting the PWM nonlinearity according to a first embodiment of the present invention.

FIG. 14 illustrates a spectrum plot over frequency of a Single Tone Input Signal at 1 KHz for Rising Edge Modulation with the Predistortion 1400 for correcting the PWM nonlinearity according to a first embodiment of the present invention. The switching frequency is chosen to be at 800 KHz.

Figure 15:
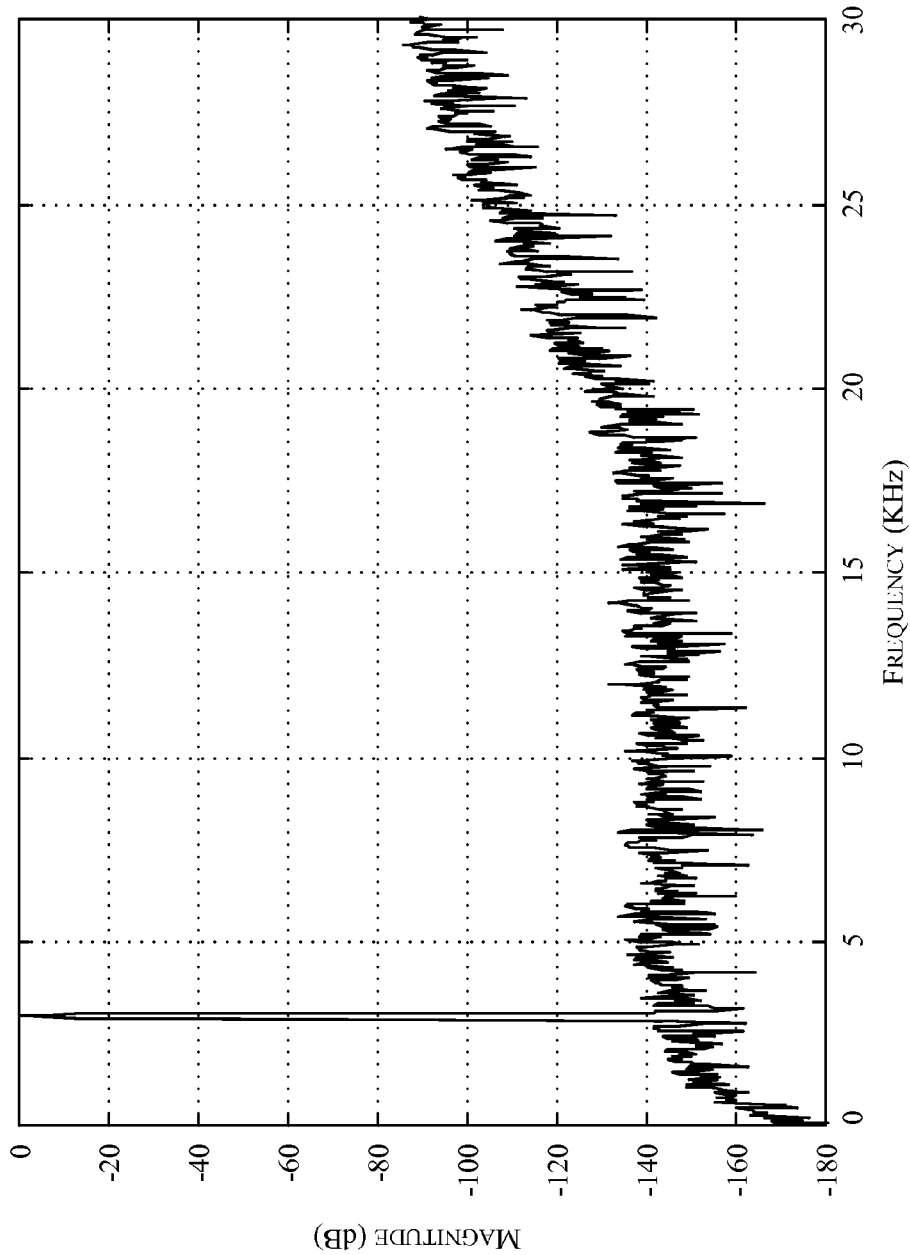
FIG. 15 illustrates a spectrum plot over frequency of a Single Tone Input Signal at 3 KHz for Rising Edge Modulation with the Predistortion for correcting the PWM nonlinearity according to a first embodiment of the present invention.

FIG. 15 illustrates a spectrum plot over frequency of a Single Tone Input Signal at 3 KHz for Rising Edge Modulation with the Predistortion 1500 for correcting the PWM nonlinearity according to a first embodiment of the present invention. The switching frequency is chosen to be at 800 KHz.

Figure 16:
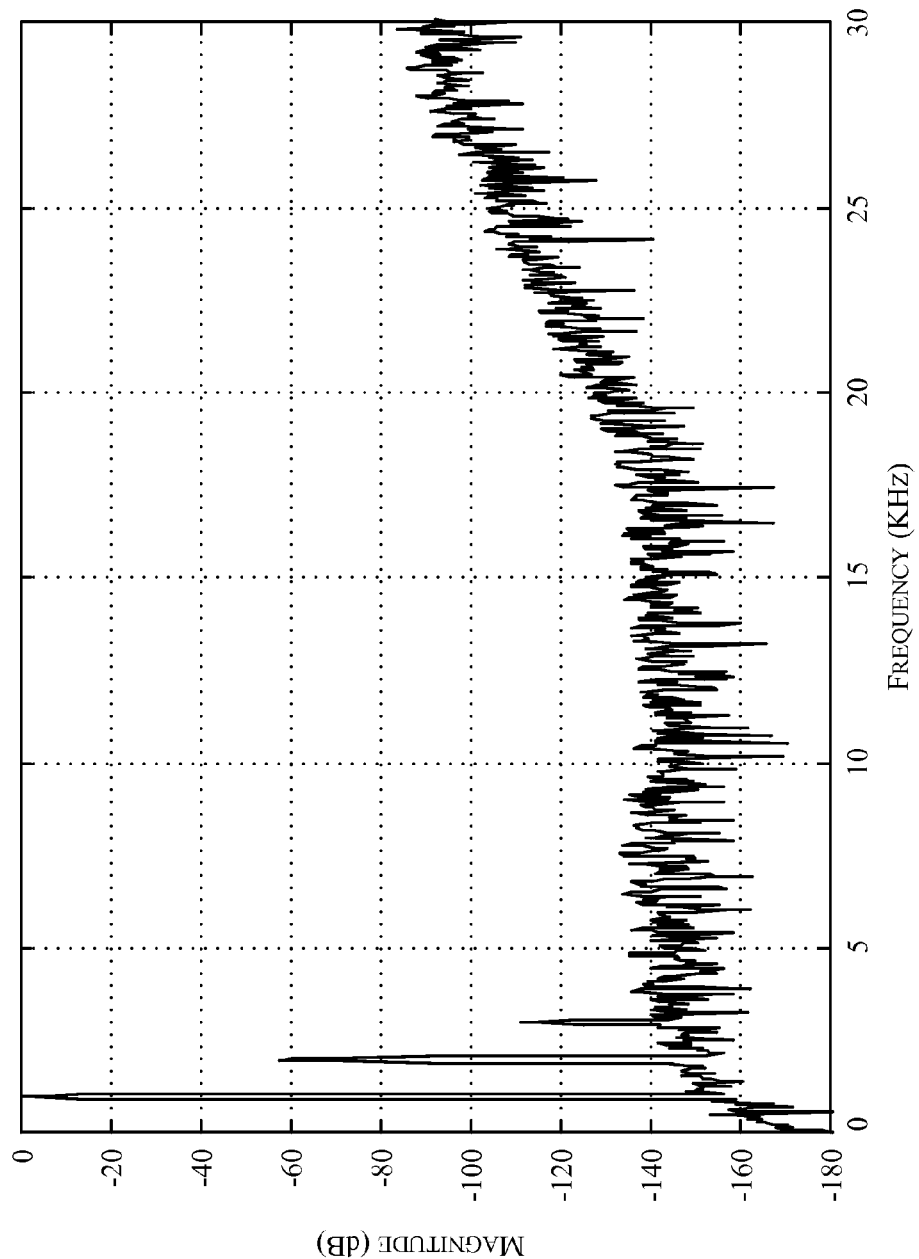
FIG. 16 illustrates a spectrum plot over frequency of a Single Tone Input Signal at 1 KHz for Falling Edge Modulation without the Predistortion for correcting the PWM nonlinearity.

FIG. 16 illustrates a spectrum plot over frequency of a Single Tone Input Signal at 1 KHz for Falling Edge Modulation without the Predistortion 1600 for correcting the PWM nonlinearity. The switching frequency is chosen to be at 800 KHz.

Figure 17:
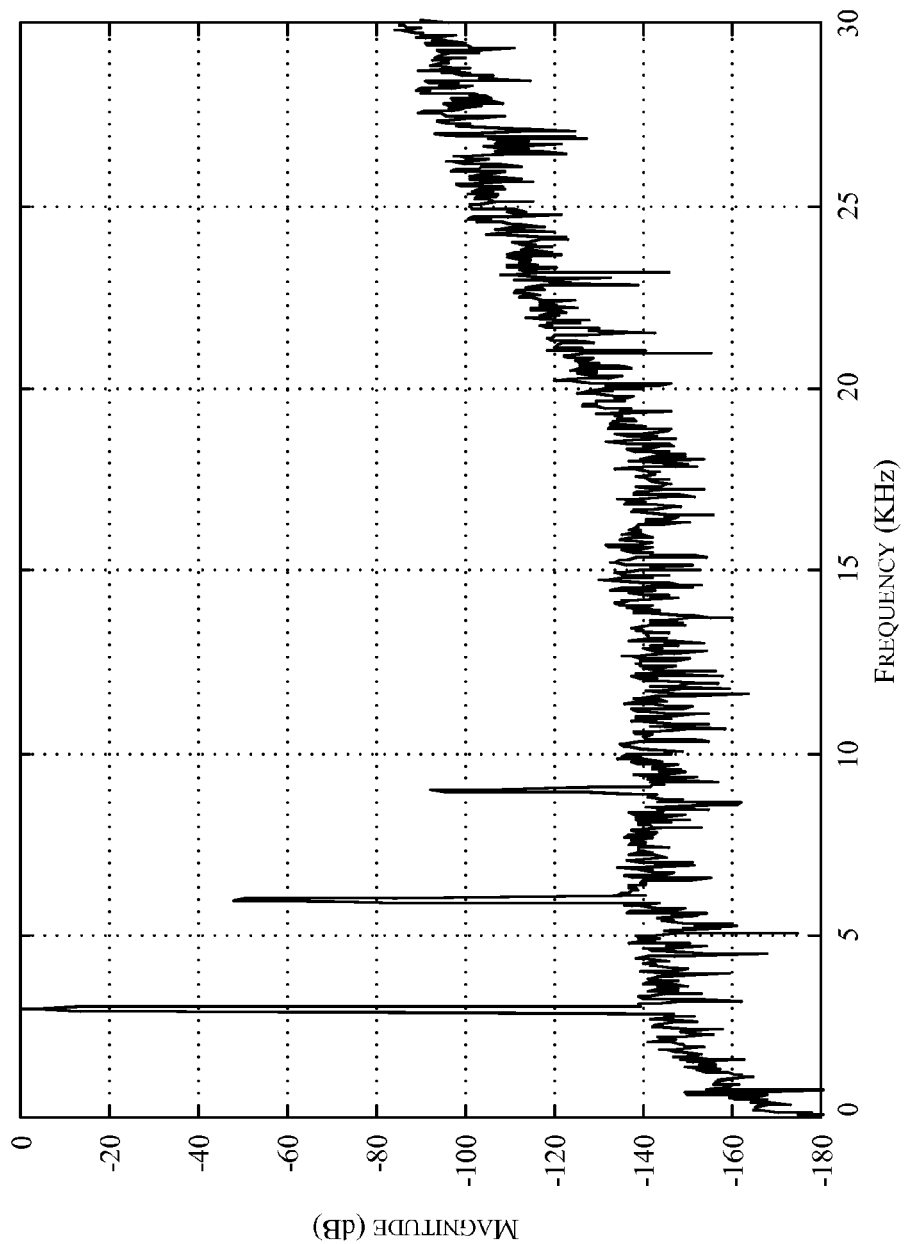
FIG. 17 illustrates a spectrum plot over frequency of a Single Tone Input Signal at 3 KHz for Falling Edge Modulation without the Predistortion for correcting the PWM nonlinearity.

FIG. 17 illustrates a spectrum plot over frequency of a Single Tone Input Signal at 3 KHz for Falling Edge Modulation without the Predistortion 1700 for correcting the PWM nonlinearity according to an embodiment of the present inventions. The switching frequency is chosen to be at 800 KHz. The highest undesired spectral content are the second and third harmonics at twice and thrice the modulation frequency at 6 KHz and 9 KHz. Relative to FIG. 16 the level of the second harmonic is higher by factor of 3 or about 9.5 dB. Relative to FIG. 16 the level of the third harmonic is higher by factor of 9 or about 19 dB. The modulation frequency in FIG. 17 is also 3 times higher than in FIG. 16.

Figure 18:
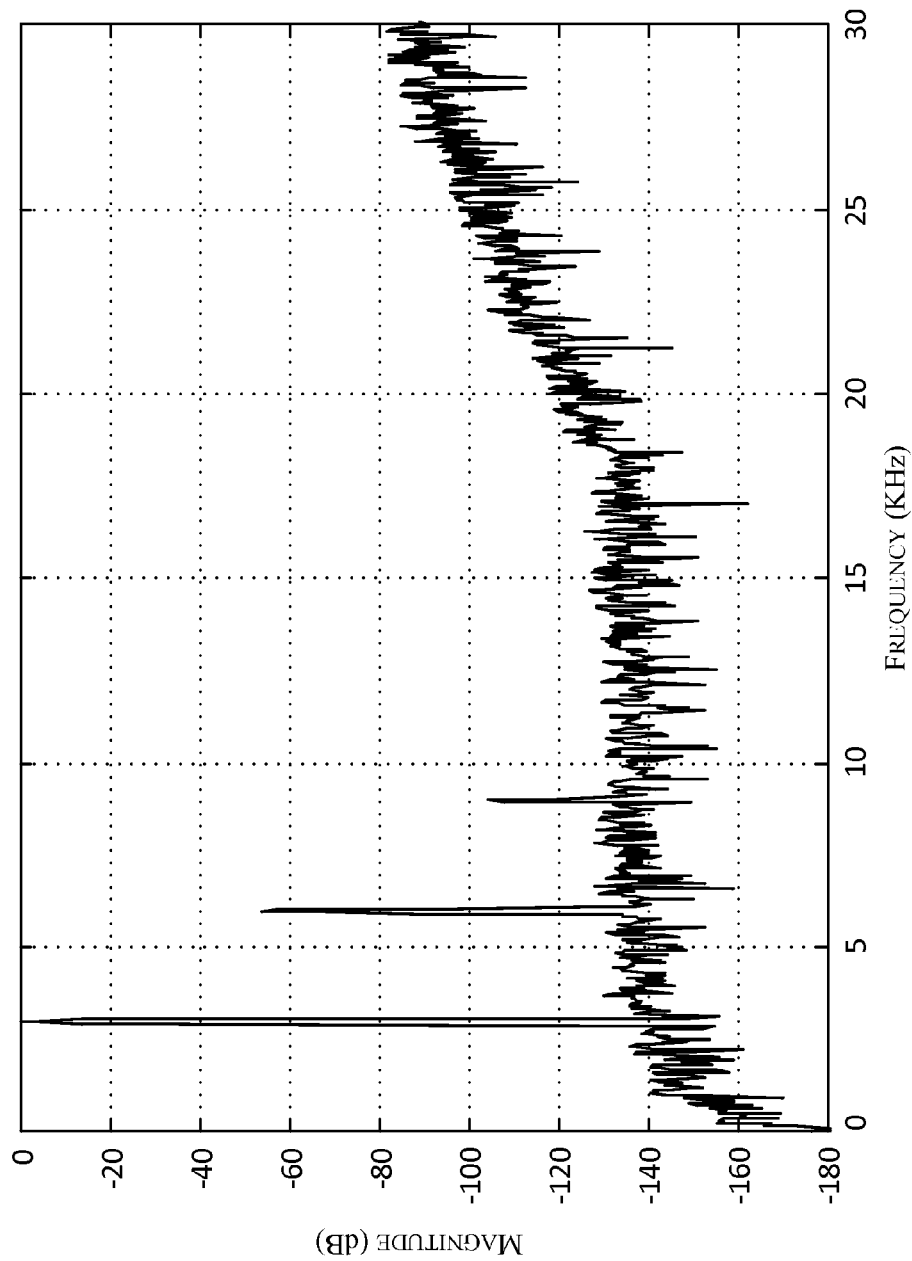
FIG. 18 illustrates a spectrum plot over frequency of a Single Tone Input Signal at 3 KHz at Reduced Volume for Falling Edge Modulation without the Predistortion for correcting the PWM nonlinearity.

FIG. 18 illustrates a spectrum plot over frequency of a Single Tone Input Signal at 3 KHz at Reduced Volume for Falling Edge Modulation without the Predistortion 1800 for correcting the PWM nonlinearity according to an embodiment of the present invention. The switching frequency is chosen to be at 800 KHz. The highest undesired spectral content is the second and third harmonics at twice and thrice the modulation frequency at 6 KHz and 9 KHz. Relative to FIG. 17 the volume has been reduced by half or 6 dB. Since the spectrum plot are normalized to make the desired tone at 0 dB all the levels have been boosted by 6 dB. Note that the levels of the harmonics are further reduced by 6 dB and 12 dB.

Figure 19:
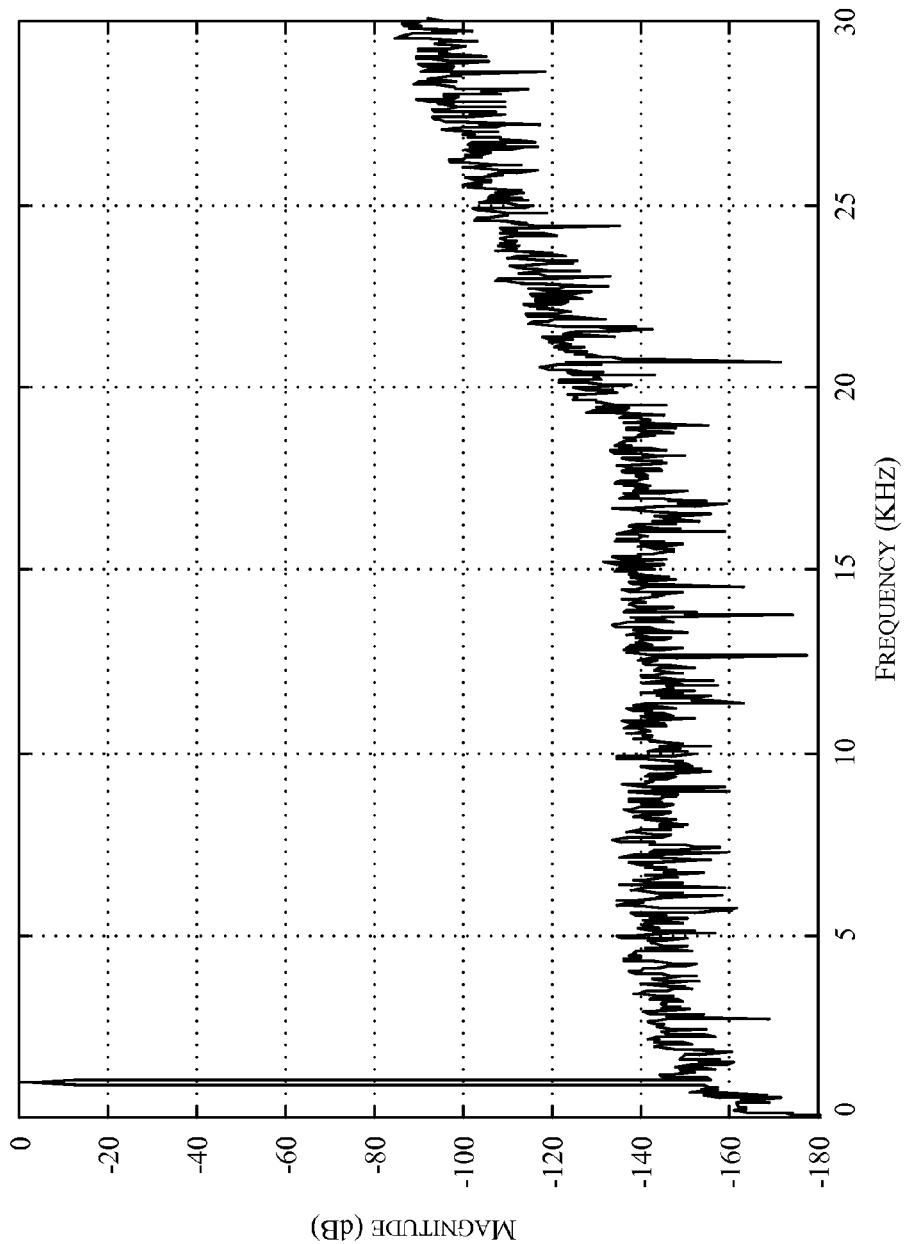
FIG. 19 illustrates a spectrum plot over frequency of a Single Tone Input Signal at 1 KHz for Falling Edge Modulation with the Predistortion for correcting the PWM nonlinearity according to a second embodiment of the present invention.

FIG. 19 illustrates a spectrum plot over frequency of a Single Tone Input Signal at 1 KHz for Falling Edge Modulation with the Predistortion 1900 for correcting the PWM nonlinearity according to an embodiment of the present inventions. The switching frequency is chosen to be at 800 KHz.

Figure 20:
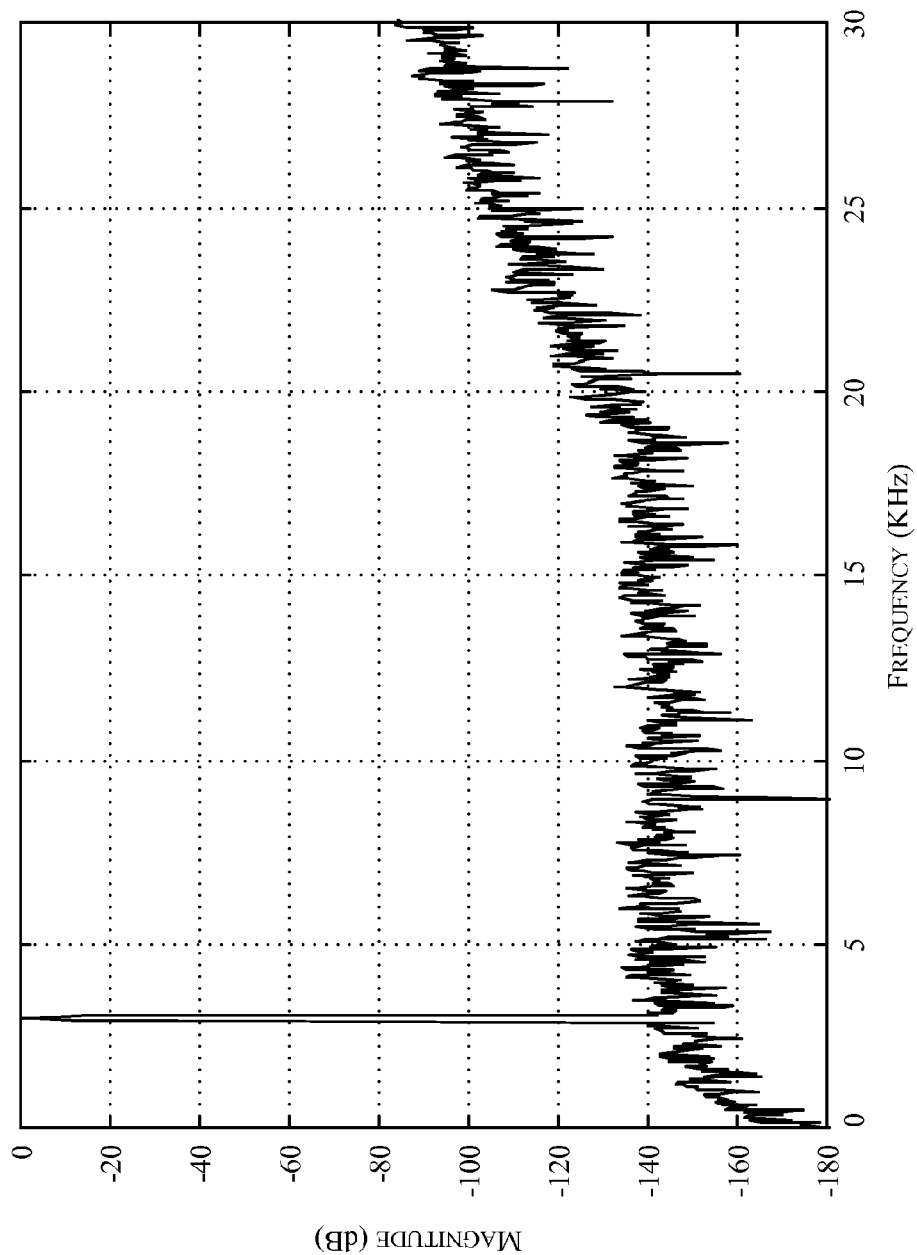
FIG. 20 illustrates a spectrum plot over frequency of a Single Tone Input Signal at 3 KHz for Falling Edge Modulation with the Predistortion for correcting the PWM nonlinearity according to a second embodiment of the present invention.

FIG. 20 illustrates a spectrum plot over frequency of a Single Tone Input Signal at 3 KHz for Falling Edge Modulation with the Predistortion 2000 for correcting the PWM nonlinearity according to an embodiment of the present inventions. There is also large content at dc. The switching frequency is chosen to be at 800 KHz.

Figure 21:
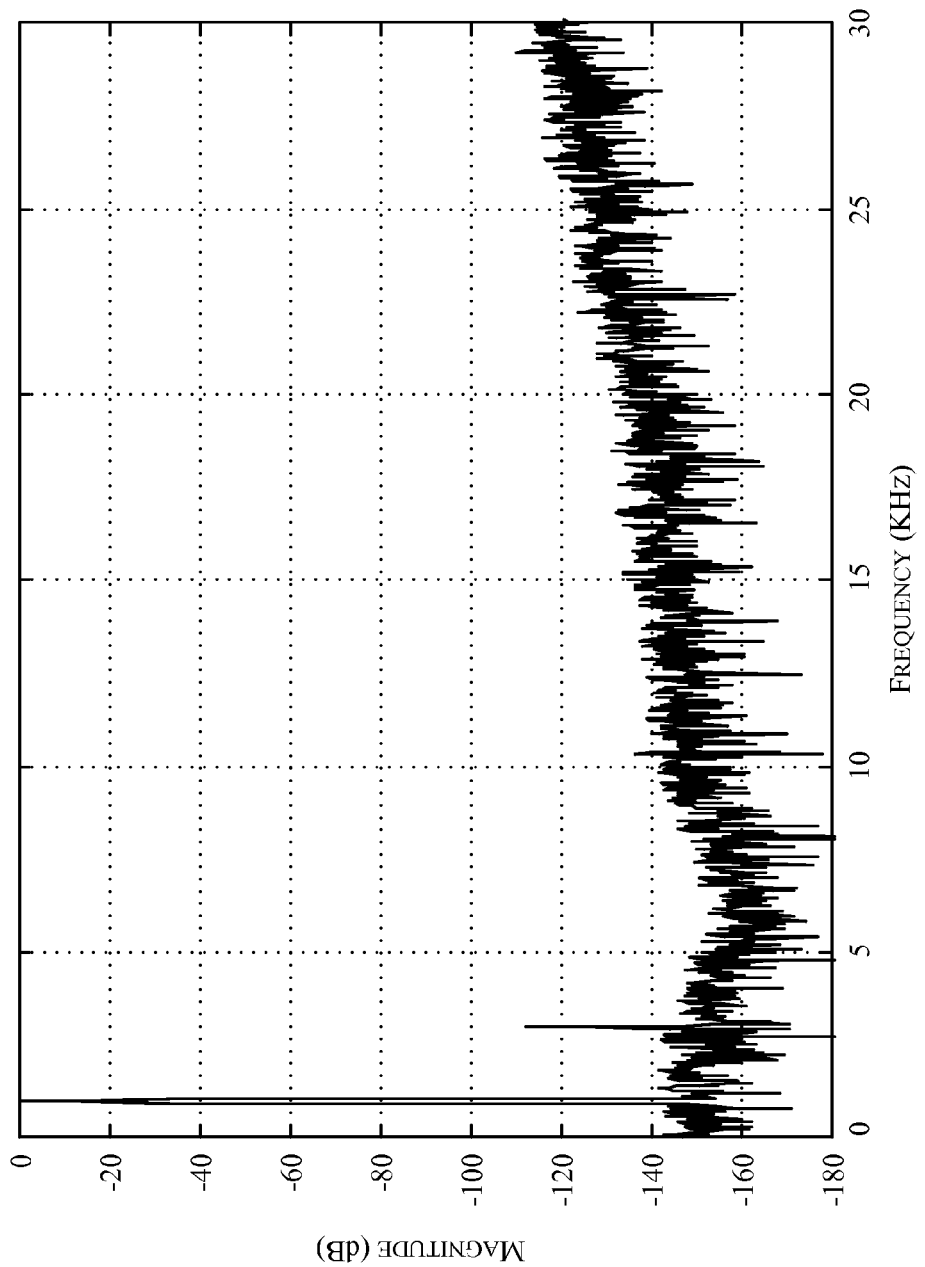
FIG. 21 illustrates a spectrum plot over frequency of a Single Tone Input Signal at 1 KHz for a Pair of Digital PWM Signals without the Predistortion for correcting the PWM nonlinearity.

FIG. 21 illustrates a spectrum plot over frequency of a Single Tone Input Signal at 1 KHz for a Pair of Digital PWM Signals without the Predistortion 2100 for correcting the PWM nonlinearity according to an embodiment of the present inventions. The switching frequency is chosen to be at 400 KHz.

Figure 22:
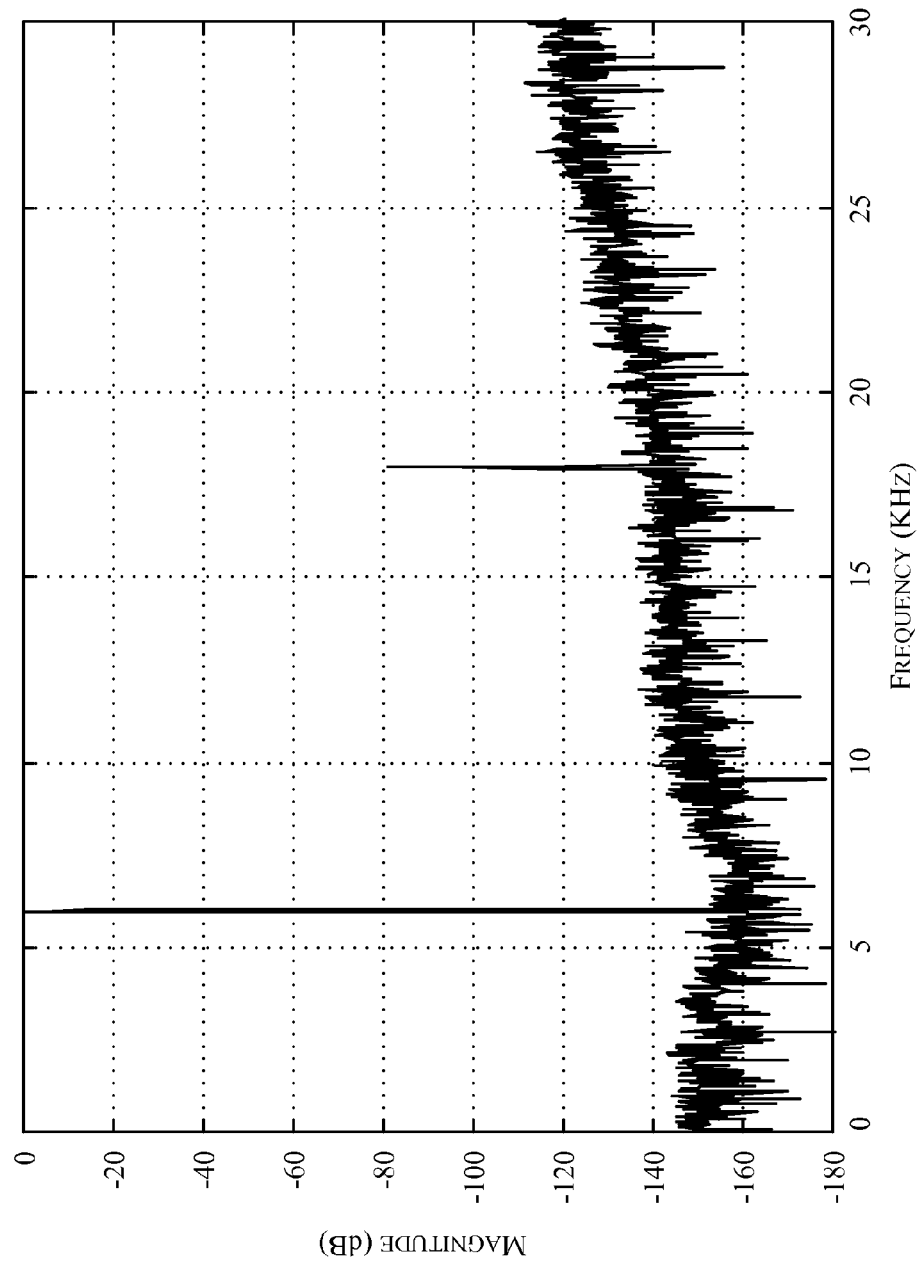
FIG. 22 illustrates a spectrum plot over frequency of a Single Tone Input Signal at 6 KHz for a Pair of Digital PWM Signals without the Predistortion for correcting the PWM nonlinearity.

FIG. 22 illustrates a spectrum plot over frequency of a Single Tone Input Signal at 6 KHz for a Pair of Digital PWM Signals without the Predistortion 2200 for correcting the PWM nonlinearity according to an embodiment of the present inventions. The switching frequency is chosen to be at 400 KHz. The highest undesired spectral content is the third harmonic at thrice the modulation frequency at 18 KHz. Relative to FIG. 21 the level of the third harmonic is higher by factor of 36 or about 31 dB. The modulation frequency in FIG. 22 is also 6 times higher than in FIG. 21.

Figure 23:
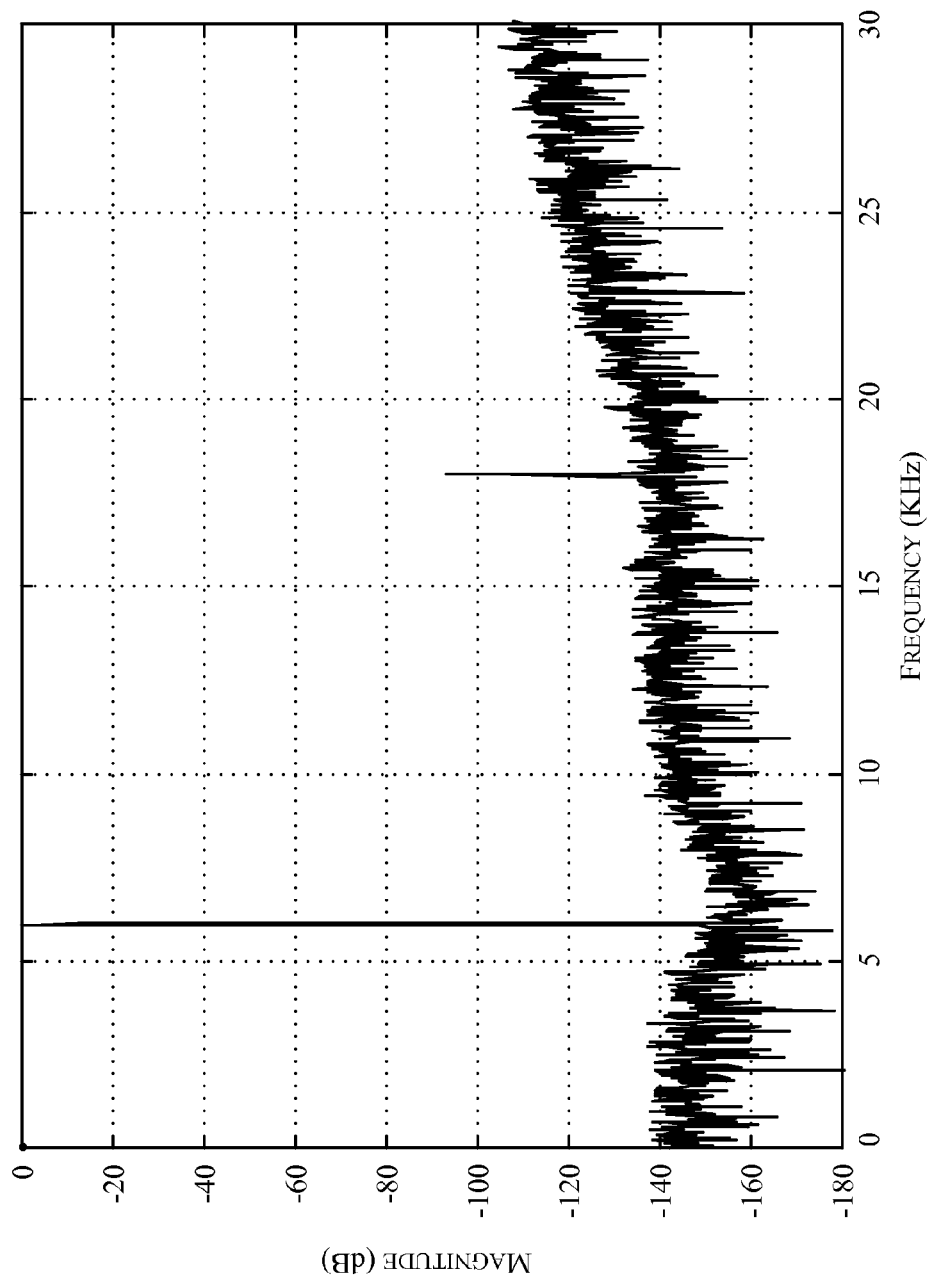
FIG. 23 illustrates a spectrum plot over frequency of a Single Tone Input Signal at 6 KHz at Reduced Amplitude for a Pair of Digital PWM Signals without the Predistortion for correcting the PWM nonlinearity.

FIG. 23 illustrates a spectrum plot over frequency of a Single Tone Input Signal at 6 KHz at Reduced Amplitude for a Pair of Digital PWM Signals without the Predistortion 2300 for correcting the PWM nonlinearity according to an embodiment of the present invention. The switching frequency is chosen to be at 400 KHz. The highest undesired spectral content is third harmonic at thrice the modulation frequency at 18 KHz. Relative to FIG. 22 the volume has been reduced by half or 6 dB. Since the spectrum plot are normalized to make the desired tone at 0 dB all the levels have been boosted by 6 dB. Note that the level of the third harmonic is further reduced by 12 dB.

Figure 24:
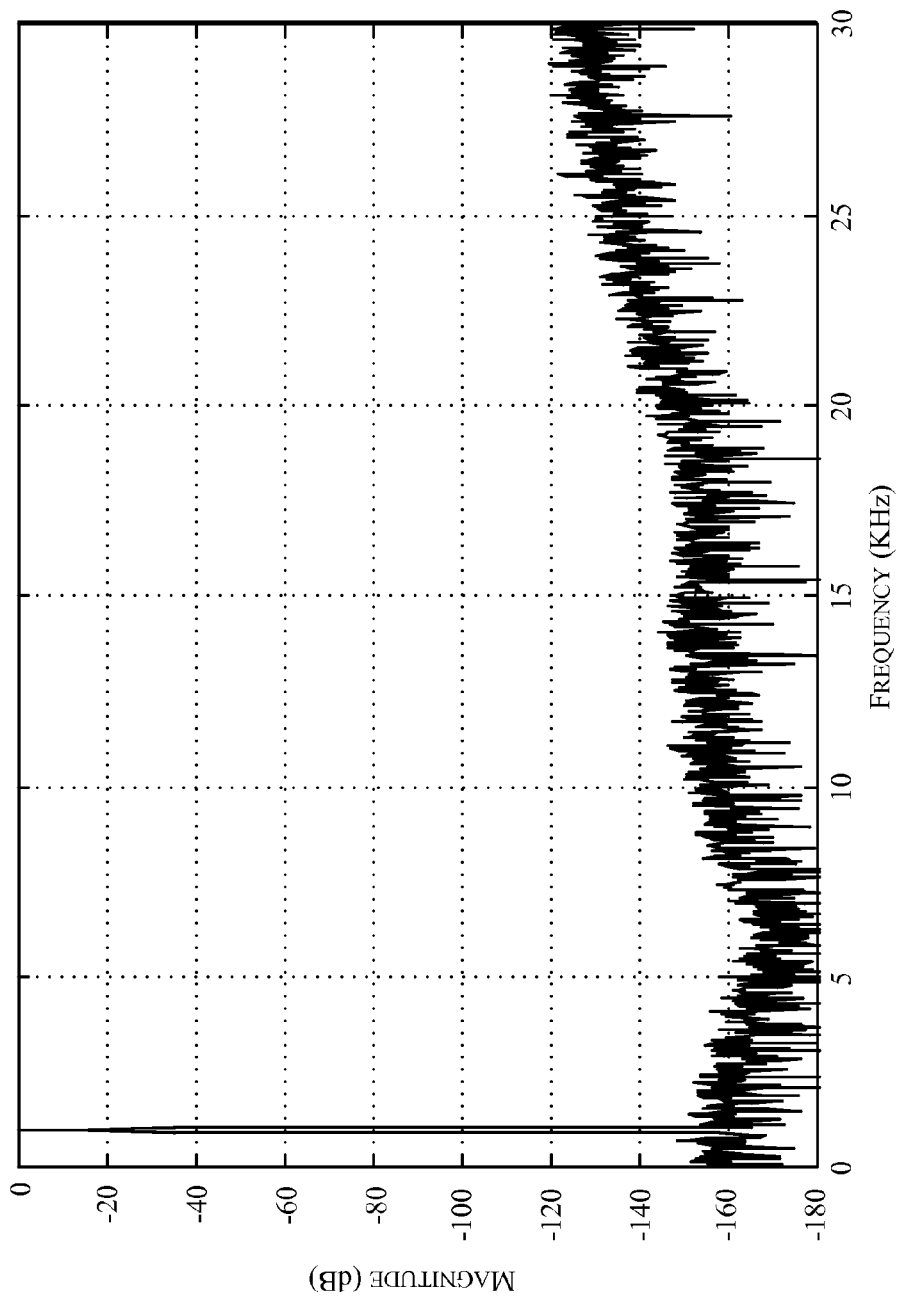
FIG. 24 illustrates a spectrum plot over frequency of a Single Tone Input Signal at 1 KHz for a Pair of Digital PWM Signals with the Predistortion for correcting the PWM nonlinearity according to a third embodiment of the present invention.

FIG. 24 illustrates a spectrum plot over frequency of a Single Tone Input Signal at 1 KHz for a Pair of Digital PWM Signals with the Predistortion 2400 for correcting the PWM nonlinearity according to a third embodiment of the present invention. The switching frequency is chosen to be at 400 KHz.

Figure 25:
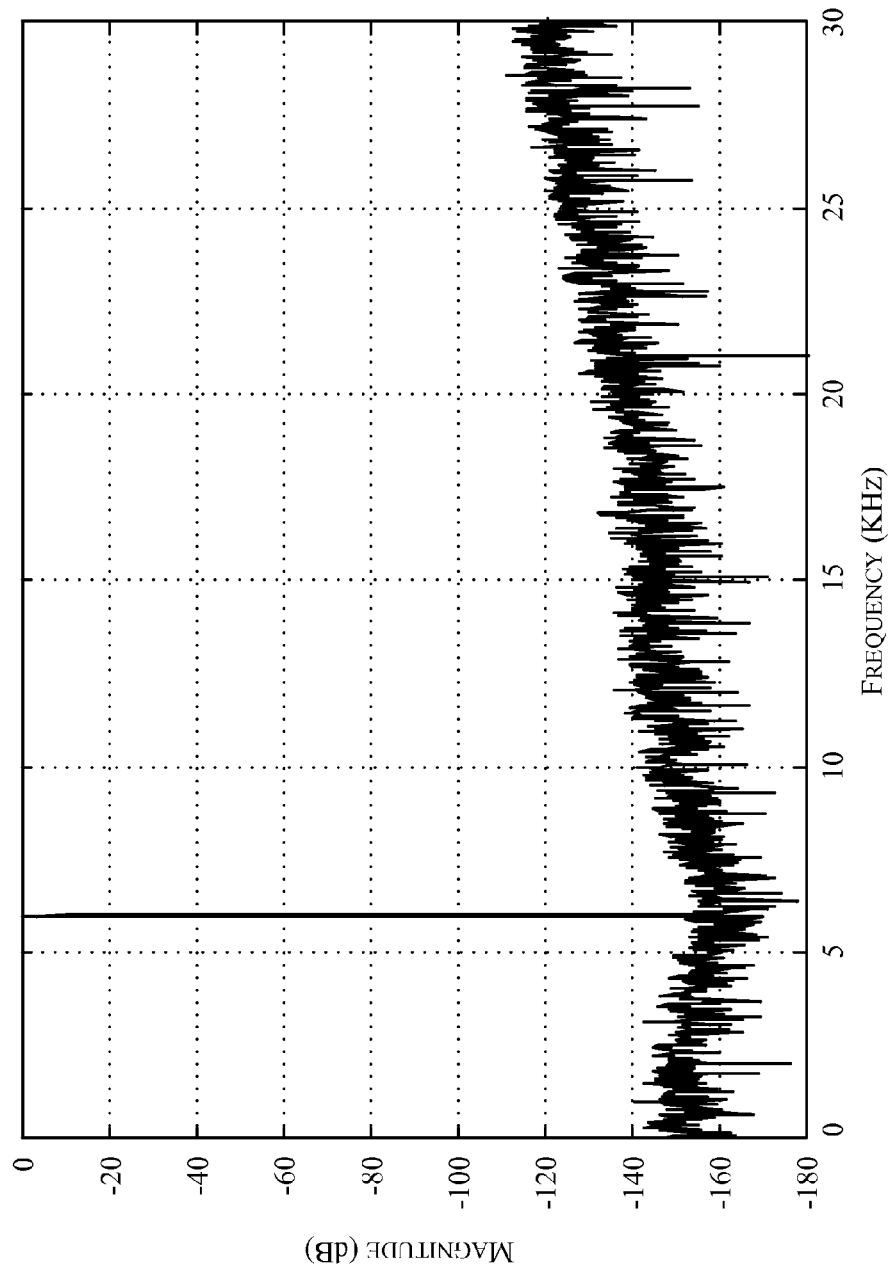
FIG. 25 illustrates a spectrum plot over frequency of a Single Tone Input Signal at 6 KHz for a Pair of Digital PWM Signals with the Predistortion for correcting the PWM nonlinearity according to a third embodiment of the present invention.

FIG. 25 illustrates a spectrum plot over frequency of a Single Tone Input Signal at 6 KHz for a Pair of Digital PWM Signals with the Predistortion 2500 for correcting the PWM nonlinearity according to a third embodiment of the present invention. The switching frequency is chosen to be at 400 KHz.

Figure 26:
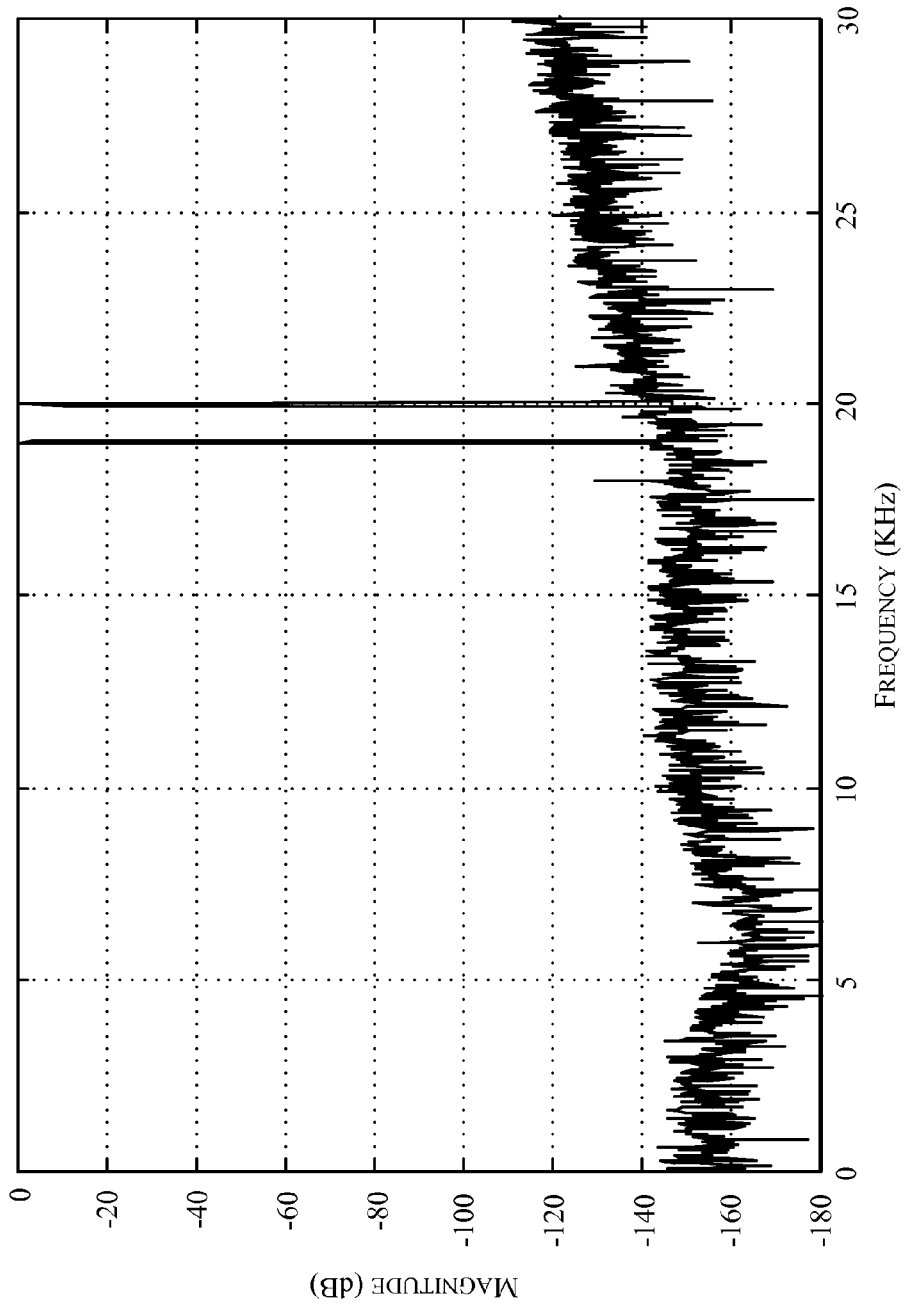
FIG. 26 illustrates a spectrum plot over frequency of a Two Tone Input Signal at 19 KHz and 20 KHz for a Pair of Digital PWM Signals with the Predistortion for correcting the PWM nonlinearity according to a third embodiment of the present invention.

FIG. 26 illustrates a spectrum plot over frequency of a Two Tone Input Signal at 19 KHz and 20 KHz for a Pair of Digital PWM Signals with the Predistortion 2600 for correcting the PWM nonlinearity according to a third embodiment of the present invention. The switching frequency is chosen to be at 400 KHz.

FIG. 27 illustrates a plot of Volume vs. SNDR (Signal to Noise plus Distortion Ratio) for a Pair of Digital PWM Signals 2700 according to a third embodiment of the present invention. The switching frequency is chosen to be at 400 KHz. The performance of the digital PWM system is also dependent on the clock frequency used by the counter in generating the Digital PWM. There are two traces in FIG. 27 marked 1 and 2 corresponding to clock frequencies of 25 MHz and 50 MHz respectively. The peak SNDR is 118 dB and 124 dB for the clock frequencies of 25 MHz and 50 MHz respectively. In this plot peak volume or 0 dB corresponds to a THD of 10% which is typical for audio.

This invention takes a Predistortion approach to the Conversion of PCM to Digital PWM. Three embodiments are considered here. Digital PWM with Rising Edge Modulation, Falling Edge modulation for driving a Half Bridge Power Stage and a Pair of Digital PWM signals for driving a Full Bridge Power Stage.

Digital PWM has perfect linearity at dc. In other words if the duty ratio of the digital PWM is constant then it produces a dc without any distortion. In general nonlinearities can be divided into memory less or with memory. The PWM nonlinearity has memory. By examining the nonlinearity associated with PWM at a couple of different frequencies and amplitudes the predistortion needed to compensate the nonlinearity of the PWM can be estimated.

In a first embodiment of Rising Edge Modulation the spectrum corresponding to a Single Tone Input of the Digital PWM Signal without Predistortion is examined as in FIGS. 11, 12 and 13. FIGS. 11 and 12 use the same large signal amplitude but with a frequencies of 1 KHz and 3 KHz respectively. In FIG. 13 the frequency is the same as FIG. 12 but the amplitude has been halved. Note that the spectrum plots are normalized such that the desired tone is at 0 dB for all the cases. It is observed in all three figures that a second and third harmonic is created at the output in addition to the fundamental. The second harmonic has a nonlinearity that is proportional to frequency. The third harmonic has a nonlinearity that is proportional to frequency squared. Comparing the amplitude variation in the nonlinearity levels between FIGS. 12 and 13 it is estimated that the second harmonic is proportional to amplitude squared and the third harmonic is proportional to the amplitude cubed.

The power stage for this PWM signal is connected to a bipolar supply having positive and negative supply rails. In normalized terms it can be considered to be +1 and −1 respectively. A null signal or null corresponds to PCM of half. Using estimates for the predistortion terms and adjusting for best spectrum output we derive the following predistortion equation for Rising Edge Modulation.

$$PCMPD = PCM(z^{-1}) - \frac{\left(PCM - \frac{1}{2}\right)^2}{4}(1 - z^{-2}) + \frac{\left(PCM - \frac{1}{2}\right)^3}{6}(1 - z^{-1})^2 \quad (1)$$

The term $$-\frac{\left(PCM - \frac{1}{2}\right)^2}{4}$$

is the second harmonic nonlinear function. The term $(1-z^{-2})$ is the second harmonic difference function. Their product $$-\frac{\left(PCM - \frac{1}{2}\right)^2}{4}(1 - z^{-2})$$

is the second harmonic PCM compensation signal. The term $$\frac{\left(PCM - \frac{1}{2}\right)^3}{6}$$

is the third harmonic nonlinear function. The term $(1-z^{-})^2$ is the third harmonic difference function. Their product $$\frac{\left(PCM - \frac{1}{2}\right)^3}{6}(1 - z^{-1})^2$$

is the third harmonic PCM compensation signal. In FIGS. 11 and 12 there are undesired second and third harmonics. Due to the second and third harmonic PCM compensation signals the harmonics are alleviated in the corresponding FIGS. 14 and 15.

The predistorted signal PCMPD is a function of PCM as well as previous sample of the PCM represented by $PCM(z^{-1})$ and the previous of previous sample of $PCM(z^{-2})$. This is using standard Z-domain digital signal processing terminology.

Note that the PCM signal has been chosen to have a range from 0 to 1 to map to a duty ratio of 0 to 1. The equations for predistortion are also based on this PCM range. Changing the range of the PCM signal would change the form of the predistortion equations.

Note that the ¼ and ⅙ terms were obtained by optimizing the output spectrum. In FIGS. 14 and 15 we get no Second or Third Harmonic and the improvement in THD performance is remarkable. The second harmonic without compensation in FIG. 12 is −48 dB. In FIG. 15 the second harmonic is below the noise floor which is at −138 dB. This is a 90 dB improvement.

In a second embodiment of Falling Edge Modulation the spectrum corresponding to a Single Tone Input of the Digital PWM Signal without Predistortion is examined as in FIGS. 16, 17 and 18. FIGS. 16 and 17 use the same large signal amplitude but with a frequencies of 1 KHz and 3 KHz respectively. In FIG. 18 the frequency is the same as FIG. 17 but the amplitude has been halved. It is observed in all three figures that a second and third harmonic is created at the output in addition to the fundamental. The second harmonic has a nonlinearity that is proportional to frequency. The third harmonic has a nonlinearity that is proportional to frequency squared. Comparing the amplitude variation in the nonlinearity levels between FIGS. 17 and 18 it is estimated that the second harmonic is proportional to amplitude squared and the third harmonic is proportional to the amplitude cubed.

The power stage for this PWM signal is connected to a bipolar supply having positive and negative supply rails. In normalized terms it can be considered to be +1 and −1 respectively. A null signal corresponds to PCM of half. Using estimates for the predistortion terms and adjusting for best spectrum output we derive the following predistortion equation for Falling Edge Modulation.

$$PCMPD = PCM(z^{-1}) + \frac{\left(PCM - \frac{1}{2}\right)^2}{4}(1 - z^{-2}) + \frac{\left(PCM - \frac{1}{2}\right)^3}{6}(1 - z^{-1})^2 \quad (2)$$

The term $$\frac{\left(PCM - \frac{1}{2}\right)^2}{4}$$

is the second harmonic nonlinear function. The term $(1-z^{-2})$ is the second harmonic difference function. Their product $$\frac{\left(PCM - \frac{1}{2}\right)^2}{4}(1 - z^{-2})$$

is the second harmonic PCM compensation signal. The term $$\frac{\left(PCM - \frac{1}{2}\right)^3}{6}$$

is the third harmonic nonlinear function. The term $(1-z^{-1})^2$ is the third harmonic difference function. Their product $$\frac{\left(PCM - \frac{1}{2}\right)^3}{6}(1-z^{-1})^2$$

is the third harmonic PCM compensation signal. In FIGS. 16 and 17 there are undesired second and third harmonics. Due to the second and third harmonic PCM compensation signals the harmonics are alleviated in the corresponding FIGS. 19 and 20.

The predistorted signal PCMPD is a function of PCM as well as previous sample of the PCM represented by $PCM(z^{-1})$ and the previous of previous sample of $PCM(z^{-2})$. This is using standard Z-domain digital signal processing terminology.

Note that the PCM signal has been chosen to have a range from 0 to 1 to map to a duty ratio of 0 to 1. The equations for predistortion are also based on this PCM range. Changing the range of the PCM signal would change the form of the predistortion equations.

Note that the ¼ and ⅙ terms were obtained by optimizing the output spectrum. In FIGS. 19 and 20 we get no second or third harmonic and the improvement in THD performance is remarkable. The second harmonic without compensation in FIG. 14 is −48 dB. In FIG. 20 the second harmonic the second harmonic is below the noise floor which is at −138 dB. This is a 90 dB improvement.

In a third embodiment of dual PWM modulation the spectrum corresponding to a Single Tone Input of the Digital PWM Signal without Predistortion is examined as in FIGS. 21, 22 and 23. FIGS. 21 and 22 use the same large signal amplitude but with a frequencies of 1 KHz and 6 KHz respectively. In FIG. 23 the frequency is the same as FIG. 22 but the amplitude has been halved. It is observed in all three figures that only a third harmonic is created at the output in addition to the fundamental. The third harmonic has a nonlinearity that is proportional to frequency squared. Comparing the amplitude variation in the nonlinearity levels between FIGS. 22 and 23 it is estimated that the third harmonic is proportional to the amplitude cubed.

The power stage for this PWM signal is connected to a unipolar supply having positive rail and ground. The two signals drive the opposite sides of the Full Bridge Power Stage. A null signal corresponds to PCM of half. Using estimates for the predistortion terms and adjusting for best spectrum output we derive the following predistortion equation for a pair of digital PWM signals.

$$PCMPD = PCM(z^{-1}) - \frac{\left(PCM - \frac{1}{2}\right)^3}{6}(1-z^{-1})^2 \quad (3)$$

The term $$-\frac{\left(PCM - \frac{1}{2}\right)^3}{6}$$

is the third harmonic nonlinear function. The term $(1-z^{-1})^2$ is the third harmonic difference function. Their product $$\frac{\left(PCM - \frac{1}{2}\right)^3}{6}(1-z^{-1})^2$$

is the third harmonic PCM compensation signal. The second harmonic is intrinsically cancelled for this embodiment of the invention. In FIGS. 21 and 22 there are undesired third harmonic. Due to the third harmonic PCM compensation signal the third harmonic is alleviated in the corresponding FIGS. 24 and 25.

The predistorted signal PCMPD is a function of PCM as well as previous sample of the PCM represented by $PCM(z^{-1})$ and the previous of previous sample of $PCM(z^{-2})$. This is using standard Z-domain digital signal processing terminology.

Note that the PCM signal has been chosen to have a range from 0 to 1 to map to a duty ratio of 0 to 1. The equations for predistortion are also based on this PCM range. Changing the range of the PCM signal would change the form of the predistortion equations.

Note that the ⅙ term was obtained by optimizing the output spectrum. In FIGS. 24, 25 and 26 we get no third harmonic and the improvement in THD performance is remarkable. The third harmonic without compensation in FIG. 22 is −80 dB. In FIG. 25 the second harmonic the second harmonic is below the noise floor which is at −135 dB. This is a 55 dB improvement.

Many of the signal processing techniques disclosed herein with reference to the accompanying drawings are preferably implemented on one or more digital signal processors (DSPs) or other microprocessors. Nevertheless, such techniques could instead be implemented wholly or partially as hard-wired circuits. To conserve power consumption and die area these inventions may be implemented in custom hardware. For audio applications fixed bit width adders and multipliers with 24 bit word length produce output signals comparable to performance shown in FIG. 24-27. Alternately, a custom processor architecture with a multiplier and accumulator unit is able to perform these operations efficiently. Further, it is appreciated by those of skill in the art that certain well known digital processing techniques are mathematically equivalent to one another and can be represented in different ways depending on choice of implementation.

Any letter designations such as (a) or (b) etc. used to label steps of any of the method claims herein are step headers applied for reading convenience and are not to be used in interpreting an order or process sequence of claimed method steps. Any method claims that recite a particular order or process sequence will do so using the words of their text, not the letter designations.

Unless stated otherwise, terms such as "first" and "second" are used to arbitrarily distinguish between the elements such terms describe. Thus, these terms are not necessarily intended to indicate temporal or other prioritization of such elements.

Any trademarks listed herein are the property of their respective owners, and reference herein to such trademarks is generally intended to indicate the source of a particular product or service.

Although the inventions have been described and illustrated in the above description and drawings, it is understood that this description is by example only, and that numerous changes and modifications can be made by those skilled in the art without departing from the true spirit and scope of the inventions. Although the examples in the drawings depict only example constructions and embodiments, alternate embodiments are available given the teachings of the present patent disclosure.

What is claimed is:

1. An apparatus for converting a PCM (pulse code modulation) signal to a PWM (pulse width modulation) signal using predistortion to alleviate harmonics, comprising:
a third harmonic nonlinear function unit for receiving the PCM signal and producing a third harmonic of the PCM signal;
a third harmonic difference function unit operatively coupled to the third harmonic nonlinear function unit to take one sixth of the third harmonic to produce a third harmonic PCM compensation signal;
an adder operatively coupled to the third harmonic difference function unit to sum the PCM signal and the third harmonic PCM compensation signal to produce a PCM predistorted signal;
a PCM to PWM converter operatively coupled to the adder to convert the PCM predistorted signal to the PWM signal with harmonics alleviated; and
a power stage operatively coupled to the PCM to PWM converter to receive the PWM signal and amplify the PWM signal.

2. The apparatus according to claim 1, wherein the power stage comprises a Half-Bridge Power Stage operatively coupled to the PCM to PWM converter to receive the PWM signal and amplify the PWM signal.

3. The apparatus according to claim 1, wherein
the third harmonic difference function unit further takes a derivative of a derivative of the third harmonic.

4. The apparatus according to claim 1,
wherein the apparatus further comprises:
a second harmonic nonlinear function unit for receiving the PCM signal and producing a second harmonic of the PCM signal; and
a second harmonic difference function unit operatively coupled to the second harmonic nonlinear function unit to take one fourth of the second harmonic to produce a second harmonic PCM compensation signal; and
wherein an adder is also operatively coupled to the second harmonic difference function unit to sum the PCM signal, the third harmonic PCM compensation signal, and the second harmonic PCM compensation signal to produce the PCM predistorted signal.

5. The apparatus according to claim 4, wherein the power stage comprises a Full-Bridge Power Stage operatively coupled to the PCM to PWM converter to receive the PWM signal and amplify the PWM signal.

6. The apparatus according to claim 4,
wherein the second harmonic difference function unit further takes a derivative of the second harmonic; and
wherein the third harmonic difference function unit further takes a derivative of a derivative of the third harmonic.

7. The apparatus according to claim 4, wherein when operating on a rising edge of the PCM signal, a negative of the second harmonic is summed by the adder and a positive of the PCM signal and the third harmonic PCM compensation signal is summed by the adder.

8. The apparatus according to claim 4, wherein when operating on a falling edge of the PCM signal, a positive of the PCM signal, the third harmonic PCM compensation signal, and the second harmonic PCM compensation signal is summed by the adder.

9. The apparatus according to claim 4,
wherein the third harmonic nonlinear function unit centers the third harmonic at a null; and
wherein the second harmonic nonlinear function unit centers the second harmonic at a null.

10. The apparatus according to claim 4,
wherein the third harmonic nonlinear function unit follows the equation third harmonic $$\text{third harmonic} = \frac{\left(PCM \text{ signal} - \frac{1}{2}\right)^3}{6}$$

wherein the third harmonic difference function unit follows the equation third harmonic PCM compensation signal=third harmonic*$(1-z^{-1})^2$
wherein the second harmonic nonlinear function unit follows the equation second harmonic $$\text{second harmonic} = \frac{\left(PCM \text{ signal} - \frac{1}{2}\right)^3}{4}$$

wherein the second harmonic difference function unit follows the equation second harmonic PCM compensation signal=second harmonic*$(1-z^{-2})$.

11. The apparatus according to claim 1, wherein
the third harmonic nonlinear function unit centers the third harmonic at a null.

12. The apparatus according to claim 1,
wherein the third harmonic nonlinear function unit follows the equation third harmonic $$\text{third harmonic} = \frac{\left(PCM \text{ signal} - \frac{1}{2}\right)^3}{6}$$

wherein the third harmonic difference function unit follows the equation third harmonic PCM compensation signal=third harmonic*$(1-z^{-1})^2$.

13. A full-bridge power amplifier for amplifying a PWM (pulse width modulation) signal converted from a PCM (pulse code modulation) signal using predistortion to alleviate harmonics, comprising:
a third harmonic nonlinear function unit for receiving the PCM signal and producing a third harmonic of the PCM signal;
a third harmonic difference function unit operatively coupled to the third harmonic nonlinear function unit to take one sixth of the third harmonic to produce a PCM compensation signal;
a second harmonic nonlinear function unit for receiving the PCM signal and producing a second harmonic of the PCM signal;
a second harmonic difference function unit operatively coupled to the second harmonic nonlinear function unit to take one fourth of the second harmonic to produce another PCM compensation signal;
an adder operatively coupled to the third harmonic difference function unit and the second harmonic difference function unit to sum the PCM signal, the PCM compensation signal, and the another PCM compensation signal to produce a PCM predistorted signal;

a PCM to PWM converter operatively coupled to the adder to convert the PCM predistorted signal to the PWM signal with harmonics alleviated; and a full-bridge power stage operatively coupled to the PCM to PWM converter to receive the PWM signal and amplify the PWM signal.

14. A half-bridge power amplifier for amplifying a PWM (pulse width modulation) signal converted from a PCM (pulse code modulation) signal using predistortion to alleviate harmonics, comprising:

a nonlinear function unit for receiving the PCM signal and producing a third harmonic of the PCM signal;

a difference function unit operatively coupled to the nonlinear function unit to take one sixth of the third harmonic to produce a PCM compensation signal;

an adder operatively coupled to the difference function unit to sum the PCM signal and the PCM compensation signal to produce a PCM predistorted signal;

a PCM to PWM converter operatively coupled to the adder to convert the PCM predistorted signal to the PWM signal with harmonics alleviated and a half-bridge power stage operatively coupled to the PCM to PWM converter to receive the PWM signal and amplify the PWM signal.

15. A method of converting a PCM (pulse code modulation) signal to a PWM (pulse width modulation) signal using predistortion to alleviate harmonics, comprising steps of:

(a) producing a third harmonic of the PCM signal;

(b) taking one sixth of the third harmonic of said step (a) to produce a third harmonic PCM compensation signal;

(c) summing the PCM signal and the third harmonic PCM compensation signal of said step (b) signal to produce a PCM predistorted signal;

(d) converting the PCM predistorted signal of said step (c) to the PWM signal with harmonics alleviated; and (e) amplifying the PWM signal.

16. The method according to claim 15, wherein said step (e) further comprises step of (e)(1) amplifying the PWM signal in a half-bridge power stage.

17. The method according to claim 15, wherein the method further comprises the step of:

(f) producing a second harmonic of the PCM signal; and (g) taking one fourth of the second harmonic of said step (f) to produce a second harmonic PCM compensation signal; and wherein said step (c) of summing sums the PCM signal, the third harmonic PCM compensation signal, and the second harmonic PCM compensation signal to produce the PCM predistorted signal.

18. The method according to claim 17, wherein said step (e) further comprises step of (e)(1) amplifying the PWM signal in a full-bridge power stage.

19. The method according to claim 17, wherein said step (b) of taking one sixth of the third harmonic comprises substep of (b)(1) taking a derivative of a derivative of the third harmonic; and wherein said step (g) of taking one fourth of the second harmonic comprises the substep of (g)(1) taking a derivative of the second harmonic.

20. The method according to claim 15, wherein said step (b) of taking one sixth of the third harmonic comprises substep of (b)(1) taking a derivative of a derivative of the third harmonic.

* * * * *